(12) United States Patent
Anderson et al.

(10) Patent No.: US 7,685,557 B2
(45) Date of Patent: Mar. 23, 2010

(54) RADIATION MASK WITH SPATIALLY VARIABLE TRANSMISSIVITY

(75) Inventors: Brent Alan Anderson, Jericho, VT (US); Edward Joseph Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 680 days.

(21) Appl. No.: 11/538,912

(22) Filed: Oct. 5, 2006

(65) Prior Publication Data

US 2008/0085456 A1    Apr. 10, 2008

(51) Int. Cl.
   *G06F 17/50*    (2006.01)
(52) U.S. Cl. .......................................... 716/19; 716/21
(58) Field of Classification Search ........................ None
   See application file for complete search history.

(56) References Cited

U.S. PATENT DOCUMENTS

| | | | |
|---|---|---|---|
| 6,187,484 B1 | 2/2001 | Glass et al. | |
| 6,326,286 B1 | 12/2001 | Park et al. | |
| 6,703,170 B1 * | 3/2004 | Pindo | 430/5 |
| 6,733,931 B2 | 5/2004 | Voutsas et al. | |
| 6,749,968 B2 | 6/2004 | Mangat et al. | |
| 6,773,870 B2 * | 8/2004 | Lai et al. | 430/321 |
| 6,906,423 B1 * | 6/2005 | Asakawa et al. | 257/775 |
| 6,961,361 B1 | 11/2005 | Tanaka | |
| 7,205,078 B2 * | 4/2007 | Osawa et al. | 430/30 |

FOREIGN PATENT DOCUMENTS

| | | |
|---|---|---|
| JP | 2003273018 A | 9/2003 |
| JP | 2003289041 A | 10/2003 |
| JP | 2004311618 A | 11/2004 |

* cited by examiner

*Primary Examiner*—Leigh Marie Garbowski
(74) *Attorney, Agent, or Firm*—Schmeiser, Olsen & Watts; Anthony J. Canale

(57) ABSTRACT

A mask, a method for creating a mask, and a method for irradiating a substrate through use of the mask. Creating the mask establishes the mask by designing the mask, forming the mask, or both designing and forming the mask. Creating the mask includes receiving a specified target transmittance ($T_S$) of the substrate with respect to radiation propagated from a radiation source and transmitted through the mask with spatial selectivity in accordance with a spatially varying transmissivity ($T_M$) of the mask with respect to the radiation. The mask is disposed between the radiation source and the substrate. The mask includes transparent portions and reflective portions distributed within the transparent portions. The first radiation after having passed through the mask is transmitted into the substrate in accordance with a spatially varying reflectance (R) of the substrate such that $T_M*(1-R)$ is about equal to $T_S$.

20 Claims, 16 Drawing Sheets

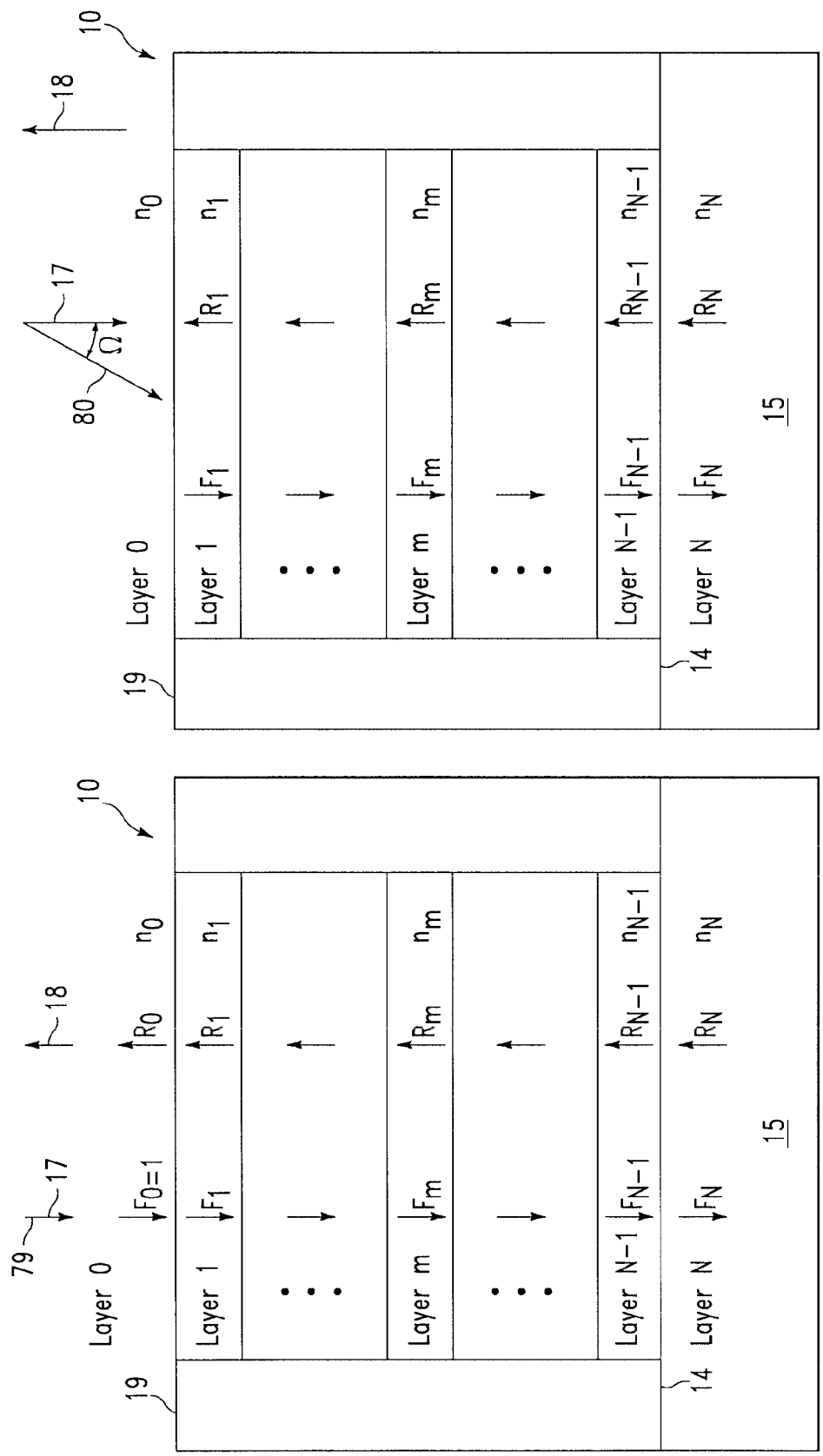

RADIATION MASK WITH SPATIALLY VARIABLE TRANSMISSIVITY

RELATED APPLICATION

This application is related to: (1) patent application Ser. No. 11/427,410 entitled "SIMULTANEOUS ILLUMINATION OF A SUBSTRATE BY MULTIPLE RADIATION SOURCES", filed on Jun. 29, 2006, and hereby incorporated by reference in its entirety; and (2) patent application Ser. No. 11/247,419 entitled "SERIAL ILLUMINATION OF A SUBSTRATE BY MULTIPLE RADIATION SOURCES", filed on Jun. 29, 2006, and hereby incorporated by reference in its entirety.

FIELD OF THE INVENTION

The present invention relates generally to irradiation of a substrate and more particularly to irradiation of a substrate via spatially selective delivery of radiation to the substrate using a mask with spatially variable transmissivity.

BACKGROUND OF THE INVENTION

Rapid thermal anneal (RTA) is used in semiconductor device fabrication to heat a wafer to alter the wafer's properties, such as to activate dopants, repair damage from ion implantation, transport dopants in or out of the wafer or to other locations within the wafer, etc.

Rapid thermal anneal of a silicon wafer is often effected through direct exposure of the wafer to electromagnetic radiation. Annealing is usually performed after patterning of multiple stacks of dielectric layers on the silicon wafer. When electromagnetic radiation is incident on these stacks, constructive and destructive interference occur due to reflections at each interface in the path of the incident radiation. As a result of the constructive and destructive interference specific to each interface in each stack, the fraction of the incident electromagnetic radiation transmitted (and absorbed) into the silicon wafer is different in the vicinity of different stack-wafer interfaces. Thus the wafer regions are not heated uniformly in these circumstances. The thermal equilibrium length (L) over which thermal equilibrium is achieved can be approximated by $L \sim (t^* k/c_v)^{1/2}$, where k and $c_v$ are the thermal conductivity and specific heat of silicon, respectively, and t is the time scale over which the incident radiation is held at a constant power density. State-of-the-art thermal processing employs electromagnetic radiation on time scales below 0.1 s and as a result thermal equilibrium is not achieved over length scales that are smaller than a typical Very Large-Scale Integration (VLSI) die size.

Thus there is a need to improve the spatial uniformity of thermal annealing of silicon wafers.

SUMMARY OF THE INVENTION

The present invention provides a method for creating a mask, comprising:

receiving a specified target transmittance ($T_S$) of a substrate with respect to a first radiation adapted to be propagated from a radiation source and transmitted through the mask with spatial selectivity in accordance with a spatially varying transmissivity ($T_M$) of the mask with respect to the first radiation; and establishing the mask, wherein the mask is adapted to be disposed between the radiation source and a surface portion of a top surface of the substrate, wherein said establishing the mask is selected from the group consisting of designing the mask, forming the mask, and both designing and forming the mask, and wherein said establishing the mask is subject to: the first radiation after having passed through the mask being denoted as a second radiation, the second radiation being transmitted into the surface portion of the substrate in accordance with a spatially varying reflectance (R) of the surface portion with respect to the second radiation, and $T_M^*(1-R)$ being about equal to $T_S$.

The present invention provides a method for irradiating a substrate, said method comprising propagating a first radiation from a radiation source through a mask disposed between the radiation source and a surface portion of a top surface of the substrate, wherein the first radiation is transmitted with spatial selectivity through the mask in accordance with a spatially varying transmissivity ($T_M$) with respect to the first radiation, wherein the first radiation after having passed through the mask being is denoted as a second radiation, wherein the second radiation is incident upon the surface portion and is transmitted into the surface portion of the substrate in accordance with a spatially varying reflectance (R) with respect to the second radiation, and wherein $T_M^*(1-R)$ is about equal to a specified target transmittance ($T_S$) of the substrate with respect to the first radiation.

The present invention provides a mask, comprising:

M mask regions such that M is at least 1;

each mask region having a same geometric structure and material composition;

each mask region comprising N mask subregions denoted as mask subregion 1, 2, ..., N such that N is at least 2;

each mask subregion of each mask region independently comprising a contiguous subregion portion and K non-contiguous subregion portions distributed within the contiguous subregion portion such that K is mask subregion independent and is at least 1;

the contiguous subregion portion of each mask subregion of each mask region of the M mask regions being about totally transparent to a first radiation incident upon the M mask regions;

the K non-contiguous subregion portions of each mask region of the M mask regions being about totally reflective or being absorptive with respect to the incident first radiation;

each non-contiguous subregion portion of the K non-contiguous subregion portions of a each mask region of the N mask regions independently having a cross-sectional shape and a cross-sectional surface area adapted to be exposed to the incident first radiation; and a transmissivity $T_M(n)$ in mask subregion n of the N mask subregions in each mask region being a spatially averaged transmissivity over the contiguous subregion portion and the K non-contiguous subregion portions in mask subregion n for n=1, 2, ..., N.

The present invention advantageously improves the spatial uniformity of thermal annealing of silicon wafers.

BRIEF DESCRIPTION OF THE DRAWINGS

FIG. 17 depicts normally incident radiation propagating through the layers of a stack in a substrate, in accordance with embodiments of the present invention.

FIG. 18 depicts radiation incident on a stack of a substrate at a solid angle, in accordance with embodiments of the present invention.

DETAILED DESCRIPTION OF THE INVENTION

1. General Formulation

Figure 1:
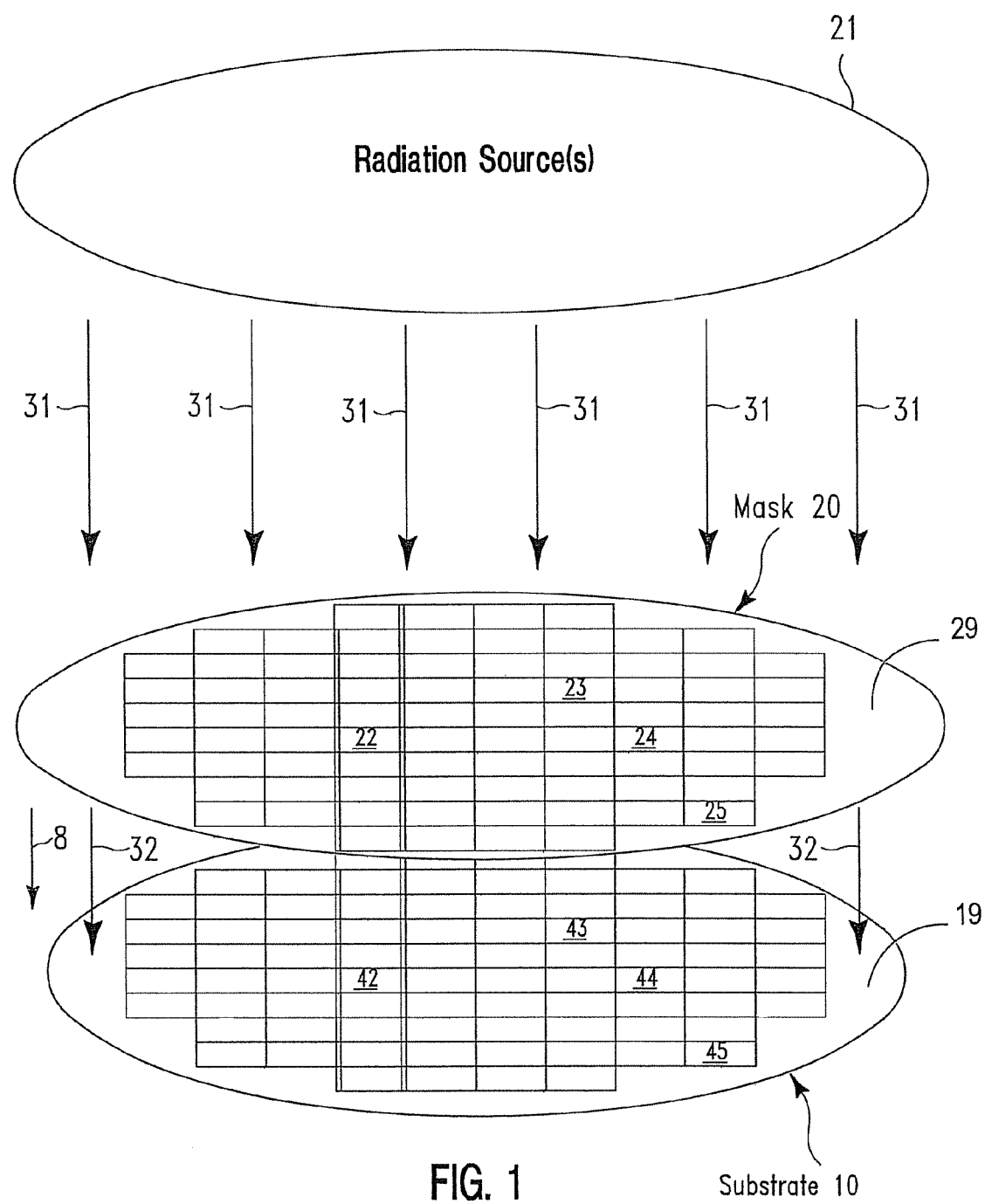
FIG. 1 is a diagram depicting propagation of a first radiation from a radiation source, through a mask, and incident upon a substrate as a second radiation, in accordance with embodiments of the present invention.

FIG. 1 is a diagram depicting propagation of first radiation 31 from a radiation source 21, through a mask 20, and incident upon a substrate 10 as second radiation 32, in accordance with embodiments of the present invention. The first radiation 31 is spatially uniform with respect to the spatial position on the top surface 29 of the mask 20. The first radiation 3 is incident upon a top surface 29 of the mask 20 and is partially reflected and/or partially absorbed while passing through the mask 20, such that the transmissivity ($T_M$) with respect to a first radiation 31 varies spatially with position on the top surface 29 of the mask 20, as described infra. The portion of the first radiation 31 that passes through the mask 20 is subsequently incident upon a top surface 19 of the substrate 10 and is referred to as the second radiation 32. The radiation source 21, which represents one or more radiation sources, emits the first radiation 31 either as a continuous spectrum of electromagnetic wavelengths to effectuate rapid thermal annealing (RTA) of the substrate 10 or alternatively emits electromagnetic radiation at just one discrete wavelength through use of a laser to effectuate laser annealing of the substrate 10.

A portion of the second radiation 32 that strikes the top surface 19 of the substrate 10 is reflected from the top surface 19 and the remaining portion of the second radiation 32 is transmitted into the substrate 10 in the direction 8 to anneal (i.e., heat) the interior of the substrate 10, in accordance with a reflectance (R) of the substrate 10 with respect to the second radiation 32. The reflectance of the substrate 10 with respect to the second radiation 32, which denotes the fraction of the energy flux of the second radiation 31 that is reflected from the top surface 19, varies with spatial position along the top surface 19 in dependence on the variation of the index of refraction of the substrate 10 with depth into the substrate in the direction 8 at each spatial position along the top surface 19. The substrate 10 has a transmittance (T) with respect to the second radiation 32 such that T=1−R. The reflectance R (or transmittance T) of the substrate 10 with respect to the second radiation 32 may be determined empirically from test data or analytically by numerical calculation such as by the numerical calculations described infra in Section 2. The present invention designs and/or forms the mask 20 such that $T_M^*(1-R)$ is about equal to a specified target transmittance ($T_S$) of the substrate 10 with respect to the first radiation 31 (i.e., $T_M^*(1-R)$ is about equal to $T_S$ to within a specified tolerance). Equivalently, the present invention designs and/or forms the mask 20 such that $T_M$ has a value equal to about $T_S/(1-R)$ (i.e., to within a specified tolerance).

The substrate 10 may be a semiconductor wafer that comprises a semiconductor material such as silicon or germanium. In the embodiments depicted in FIG. 1, the substrate 10 comprises 82 substrate regions denoted by reference numerals 41, 42, 43, 44, 45, etc. Generally, the substrate 10 may comprise one or more substrate regions. In one embodiment, the substrate 10 comprises a plurality of substrate subregions. Most of the substrate regions of the substrate 10 are depicted in FIG. 1 without reference numerals. Each substrate regions of the substrate 10 may have a same geometry and a same material composition, and the substrate regions may be about identical to each other. The material composition of each substrate region may comprise a semiconductor material such as silicon or germanium. The substrate regions may be semiconductor chips or may be adapted to become semiconductor chips upon further processing.

The mask 20 comprises a distribution of mask regions denoted by reference numerals 22, 23, 24, 25, etc. which map to corresponding chip 42, 43, 44, 45, etc. Each mask regions of the mask 20 may have a same geometry and material composition. In FIG. 1, the substrate 10 has 82 substrate regions, and the mask 20 has 82 mask regions respectively corresponding to the 82 substrate regions of the substrate 10.

The present invention is directed to designing the transmissive properties of the mask 20 so as to control the spatial distribution of transmittance across each substrate region of the substrate 10 in a direction that is parallel to the top surface 19 (i.e., in a direction that is perpendicular to the direction 8), with respect to the spatially uniform first radiation 31 emitted by the radiation source 21. The mask 20 transforms the spatially uniform first radiation 31 to the spatially nonuniform second radiation 32.

The transmittance of the substrate 10 with respect to the second radiation 32 is defined as the fraction of the energy flux of the second radiation 32 that is transmitted into the substrate 10 in the direction 8. The transmittance of the substrate 10 with respect to the first radiation 31 is defined as the fraction of the energy flux of the first radiation 31 that is transmitted into the substrate 10 in the direction 8. Thus, the transmittance of the substrate 10 with respect to the second radiation 32 depends on material properties (i.e., spatial variation of index of refraction) of the substrate 10 and is independent of the transmissive properties of the mask 20. In contrast, the transmittance of the substrate 10 with respect to the first radiation 31 depends on both material properties (i.e., spatial variation of index of refraction) of the substrate 10 and the transmissive properties of the mask 2.

Consider a specified target transmittance ($T_S$) of the substrate 10 with respect to the first radiation 31 as a function of spatial position across each substrate region of the substrate 10 in a direction that is parallel to the top surface 19. The specified target transmittance ($T_S$) may be provided as an input to the design and/or formation of the mask 20 and represents a reference of standard for controlling the actual transmittance (T) by the designed and/or formed mask 20 as will be explained infra. The transmissivity ($T_M$) of the mask 20 is defined as the fraction of the energy flux of the first radiation 31 that is transmitted through to mask 20 and becomes the second radiation 32. The transmissivity of the mask 20 is such that the transmittance T of the substrate 10 with respect to the first radiation 31 is about equal to the specified target transmittance $T_S$ (i.e., T matches $T_S$ to within a specified tolerance). In one embodiment, the specified target transmittance is selected to be spatially uniform so as to effectuate a spatially uniform heating of substrate 10 during the annealing of the substrate 10 by the incident second radiation 32. In one embodiment, the specified target transmittance is spatially nonuniform. The specified target transmittance may be chosen or determined to satisfy a design objective or an operational objective during the annealing of the substrate 10 by the incident second radiation 32, such as, inter alia, a spatially uniform heating of substrate 10, a linear spatial distribution of heating of substrate 10, a localized heating of substrate 10, etc.

Figure 2:
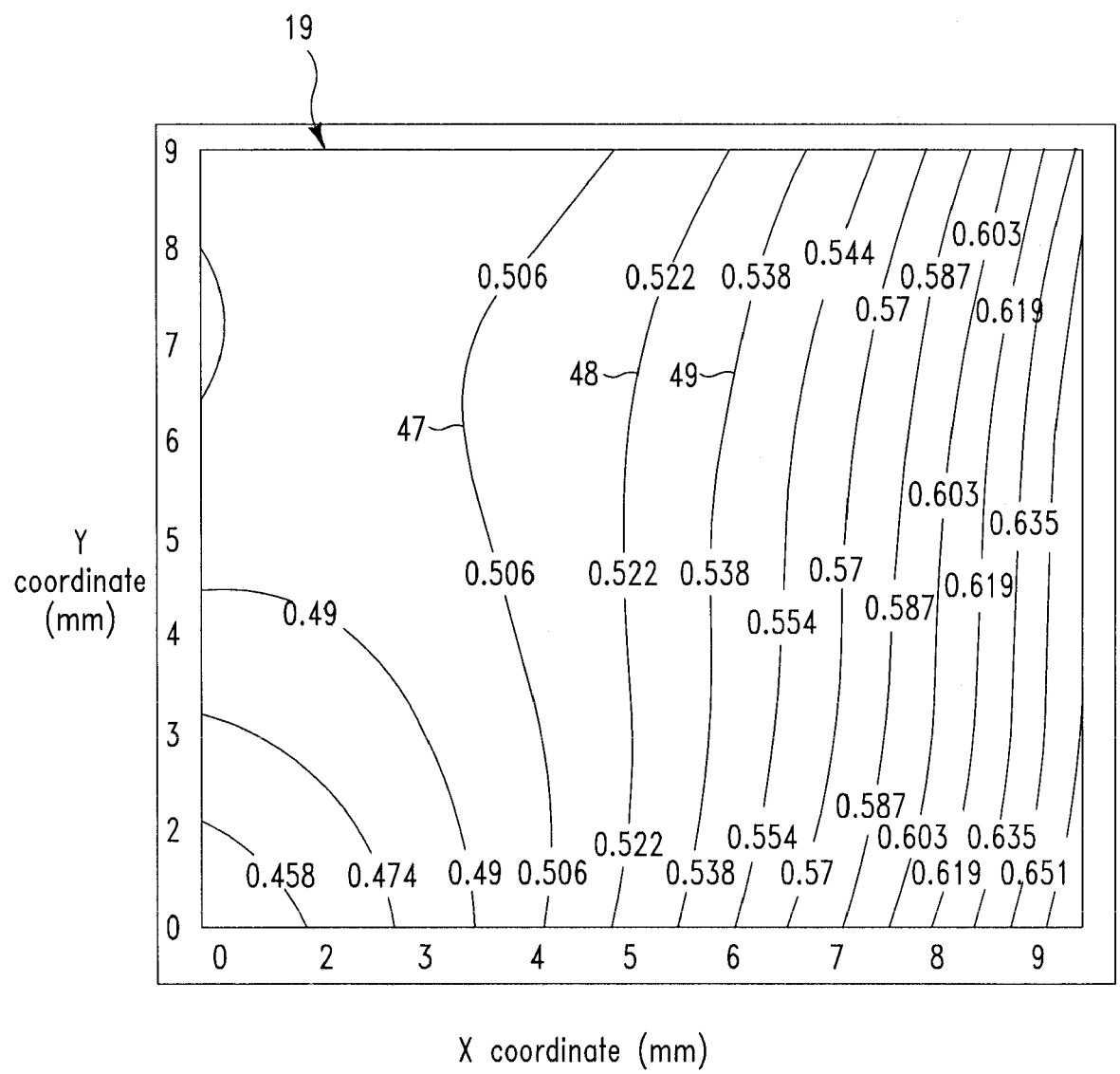
FIG. 2 is a contour plot of reflectance of a representative substrate region of the substrate of FIG. 1 across the top surface of the substrate region, in accordance with embodiments of the present invention.

FIG. 2 is a contour plot of reflectance of a representative substrate region of the substrate 10 (e.g., substrate region 41, 42, 43, or 44, etc.) of FIG. 1 across the top surface 19 of the substrate region with respect to the second radiation 32, in accordance with embodiments of the present invention. For example contours 47, 48, and 49 have an associated reflectance of 0.506, 0.522, and 0.538, respectively. The reflectances used for determining the contour plots may be determined empirically from test data or analytically by numerical calculation (e.g., as described infra in Section 2). Spatial position on the top surface 19 of the represented substrate region is expressed in terms of Cartesian coordinates X and Y as shown.

Figure 3:
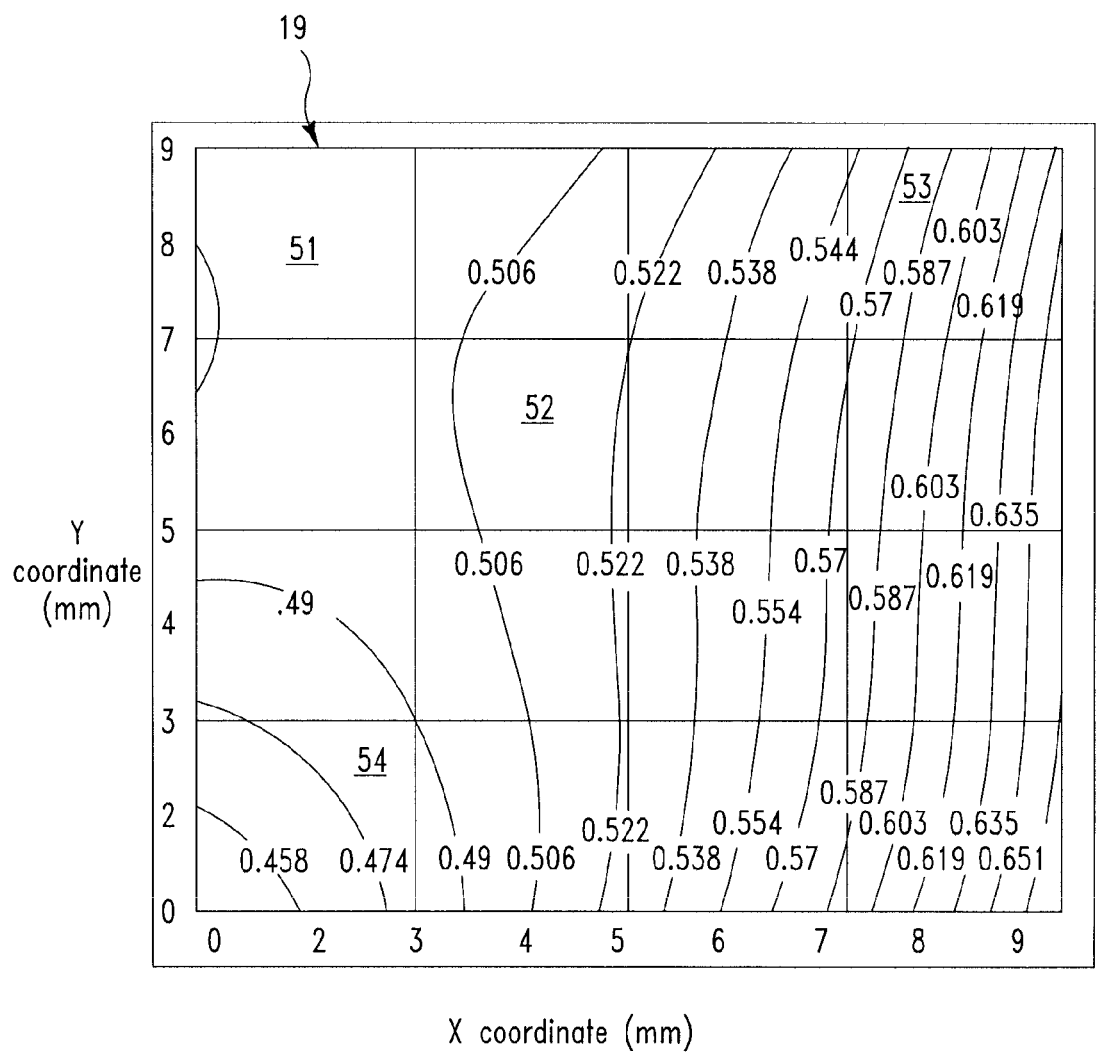
FIG. 3 depicts the contour plots of reflectance of FIG. 2 such that the representative substrate region of the substrate has been partitioned into a 4×4 array of substrate subregions, in accordance with embodiments of the present invention.

FIG. 3 depicts the contour plots of reflectance of FIG. 2 such that the representative substrate region of the substrate 19 has been partitioned into a 4×4 array of substrate subregions, in accordance with embodiments of the present invention. Each linear dimension of each subregion is less than a thermal equilibrium length. Reference numeral 51, 52, 53, and 54 associated with 4 of the 16 substrate subregions are shown in FIG. 3. Although the top surface of the substrate subregions of the represented substrate region each have a square shape in FIG. 3, the top surface of the substrate subregions of a substrate region may independently have any assigned shape (e.g., square, rectangular, triangular, circular, elliptical, etc.). Although the top surface of the substrate subregions of the represented substrate region in FIG. 3 have the same geometric shape, the top surface of the substrate subregions of a substrate region may have different geometric shapes.

Figure 4:
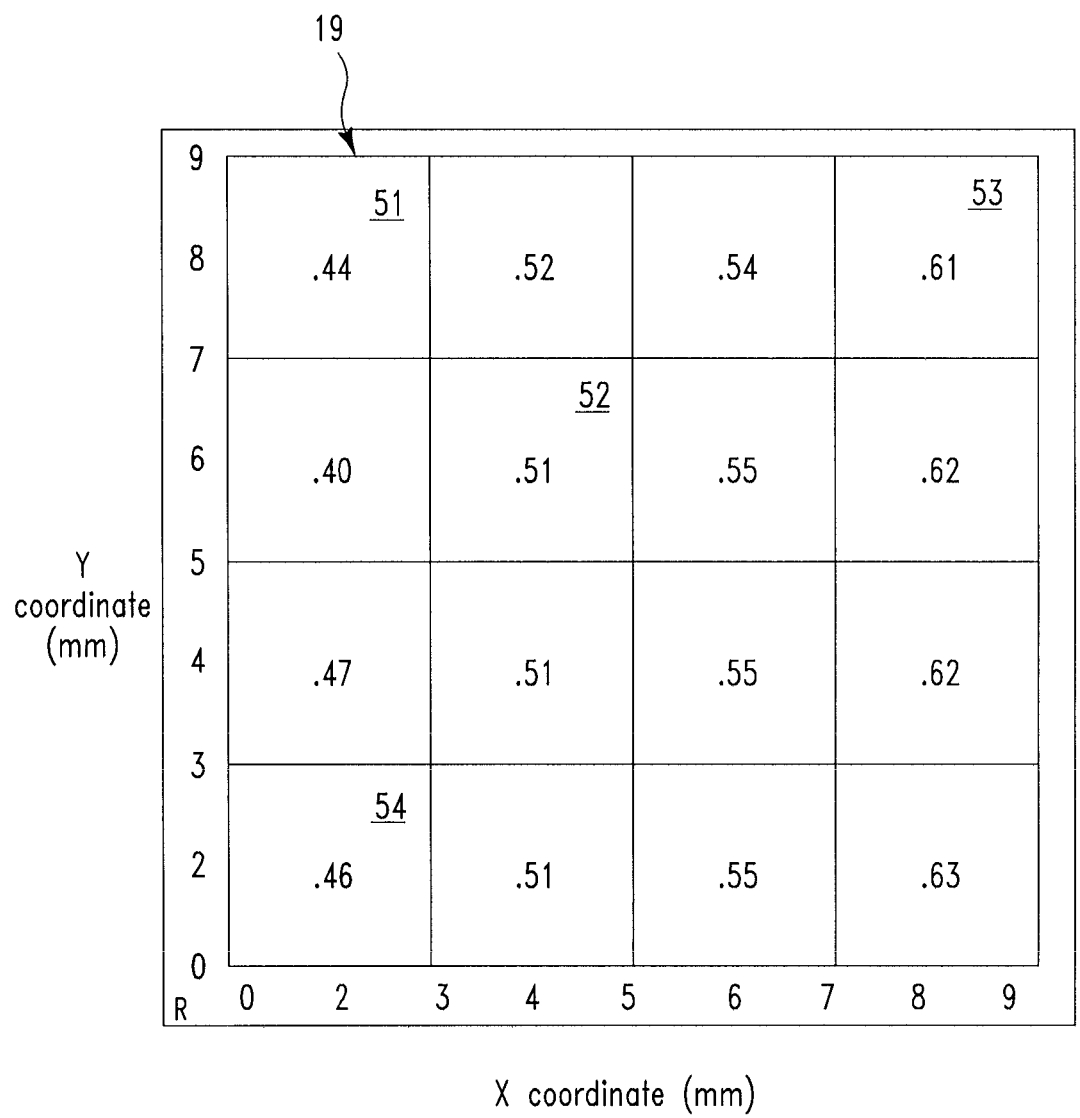
FIG. 4 depicts an average value of reflectance in each substrate subregion of the representative substrate region of FIG. 3, in accordance with embodiments of the present invention.
Figure 5:
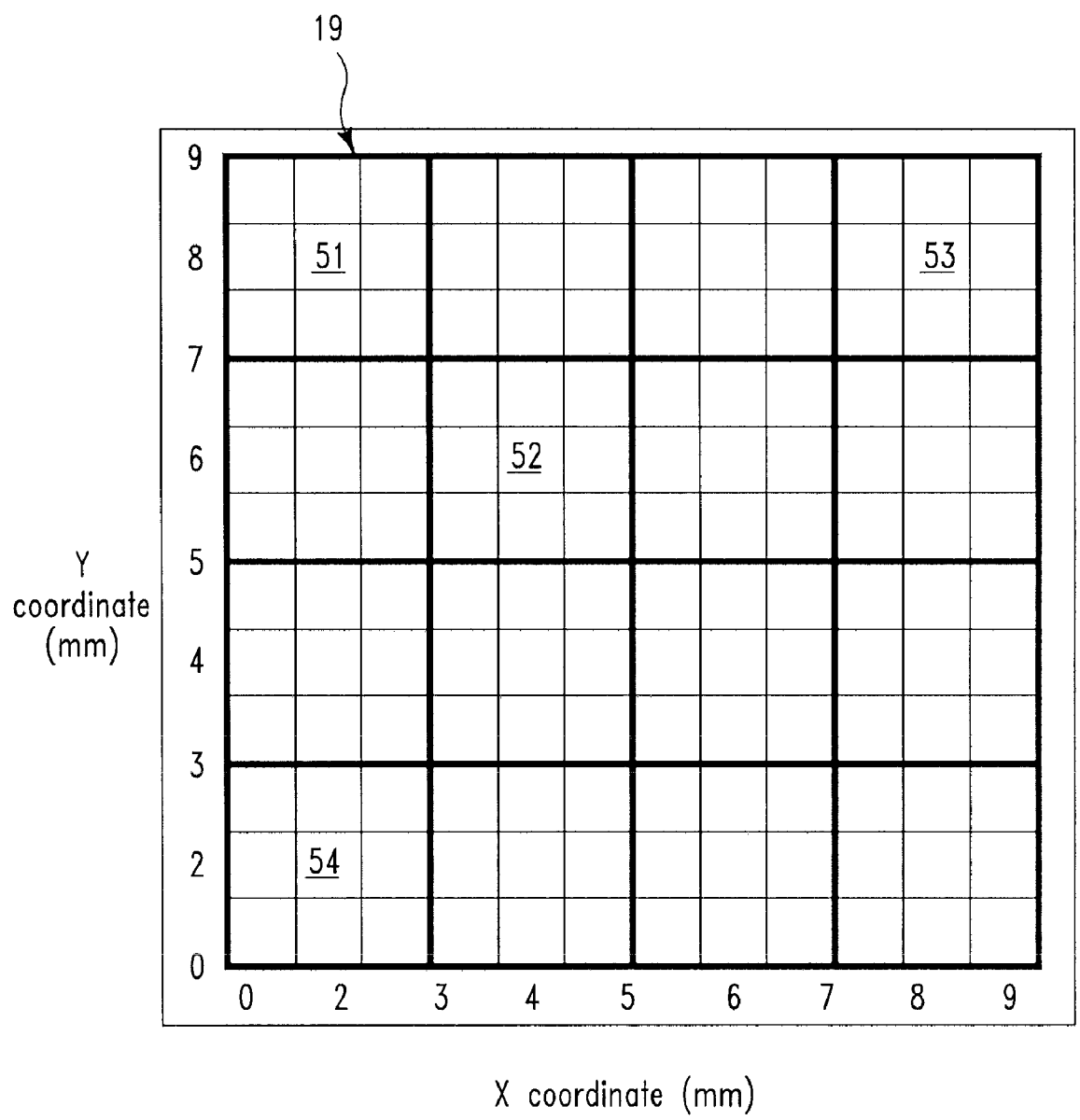
FIG. 5 depicts a fine mesh superimposed on the substrate subregions of FIG. 4 to facilitate the calculation of average reflectance 4 for the substrate subregions, in accordance with embodiments of the present invention.

FIG. 4 depicts an average value of reflectance in each substrate subregion of the representative substrate region of FIG. 3, in accordance with embodiments of the present invention. For example, substrate subregions 51, 52, 53, 54 have average reflectance of 0.41, 0.51, 0.61, 0.46, respectively FIG. 5 depicts a fine mesh superimposed on the substrate subregions of FIG. 4 to facilitate the calculation of the average reflectances shown in FIG. 4 for the substrate subregions, in accordance with embodiments of the present invention. In FIG. 5, the fine mesh in each substrate subregion includes 9 mesh boxes organized in a 3×3 matrix of mesh boxes. For each substrate subregion, an individual reflectance is calculated at the centroid of each mesh box of the fine mesh. Then individual reflectances are averaged over the mesh boxes of each substrate subregion to arrive at the average reflectances shown in FIG. 4 for the substrate subregions. The individual reflectance at each mesh box may be determined empirically from test data or analytically by numerical calculation (e.g., as described infra in Section 2). Although the preceding discussion describes an averaging process associated with FIG. 5 for calculating the average reflectances shown in FIG. 4 for the substrate subregions, any suitable averaging process may be used to arrive at the average reflectances of the substrate subregions in FIG. 4. Although each subregion in FIG. 5 has 3/3 fine mesh, each subregion may independently have any number of mesh boxes as needed to obtain the average reflectances to a specified accuracy.

Figure 6:
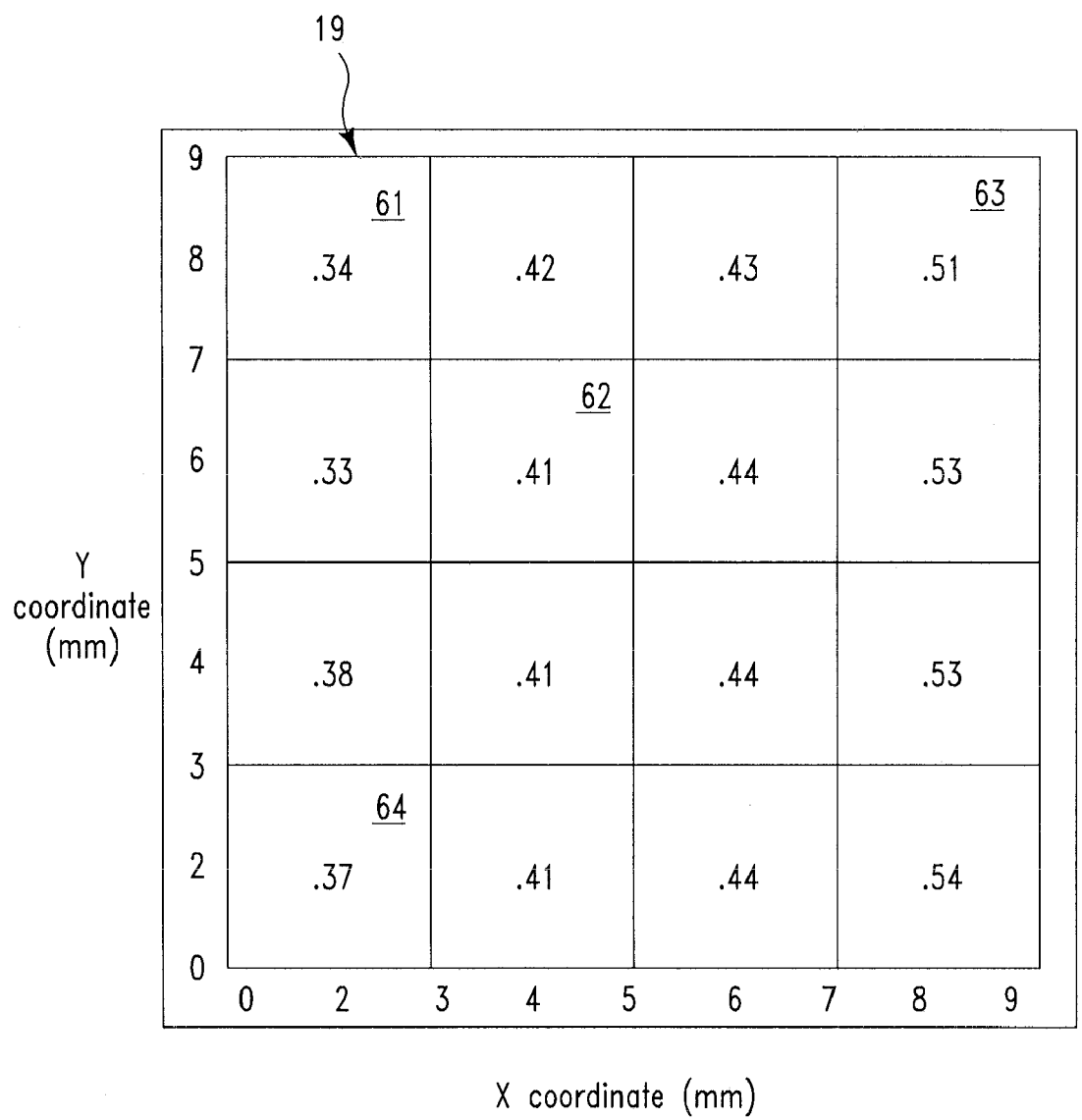
FIG. 6 depicts a 4×4 array of mask subregions of a representative mask region, in accordance with embodiments of the present invention.

Each mask region of the mask 20 of FIG. 1 is divided into mask subregions. Each mask subregion of a mask region of the mask 20 corresponds to an associated substrate subregion of an associated substrate region of the substrate 20. FIG. 6 depicts a 4×4 array of mask subregions of a representative mask region, in accordance with embodiments of the present invention. Each mask subregion of FIG. 6 corresponds to an associated substrate subregion of FIG. 4. For example, the mask subregions 61, 62, 63, 64 of FIG. 6 respectively correspond to the substrate subregions 51, 52, 53, 54 of FIG. 4.

Let N denote both the number of substrate subregions in each mask region and the number of mask subregions in each mask region. Let n index both the substrate subregions and the mask subregions (i.e., n=1, 2, . . . , N). R(n) is defined as the reflectance of substrate subregion n with respect to the second radiation 32 of FIG. 1, wherein the transmittance of substrate subregion n with respect to the second radiation 32 is denoted as T(n) such that T(n)=1−R(n). $T_M(n)$ is defined as the transmissivity of mask subregion n. $T_S(n)$ is defined as a specified target transmittance for substrate subregion n with respect to the first radiation 31. Based on the preceding definitions, the mask subregions may be configured such that the value of $T_M(n)$ is determined via:

$$T_M(n)*(1-R(n))=T_S(n) \qquad (1)$$

The expression $T_M(n)*(1-R(n))$, which is equivalent to $T_M(n)*T(n)$, is an "actual transmittance" of the substrate subregion n with respect to the first radiation. Therefore, the actual transmittance of the substrate subregion n with respect to the first radiation depends on both T(n) (which is a property of the substrate subregion n with respect to the incident second radiation 32) and $T_M(n)$ (which is a property of the mask subregion n with respect to the first radiation 31).

A numerical value for the transmissivity $T_M(n)$ is shown for each mask subregion n in FIG. 6. For example, mask subregions 61, 62, 63, 64 have the transmissivity $T_M(n)$ of 0.34, 0.41, 0.51, 0.37, respectively, based on the reflectances R(n) of the substrate subregions shown in FIG. 4, under the assumption that the specified target transmittance $T_S(n)$ has the constant value of 0.2. Using substrate subregion 51 of FIG. 4 and its associated mask subregion 61 of FIG. 6 as an example, Equation (1) may be used to calculate the transmissivity $T_M(n)$ for mask subregion 61 via $T_M(n)=0.2/(1-0.41)=0.34$.

Figure 7:
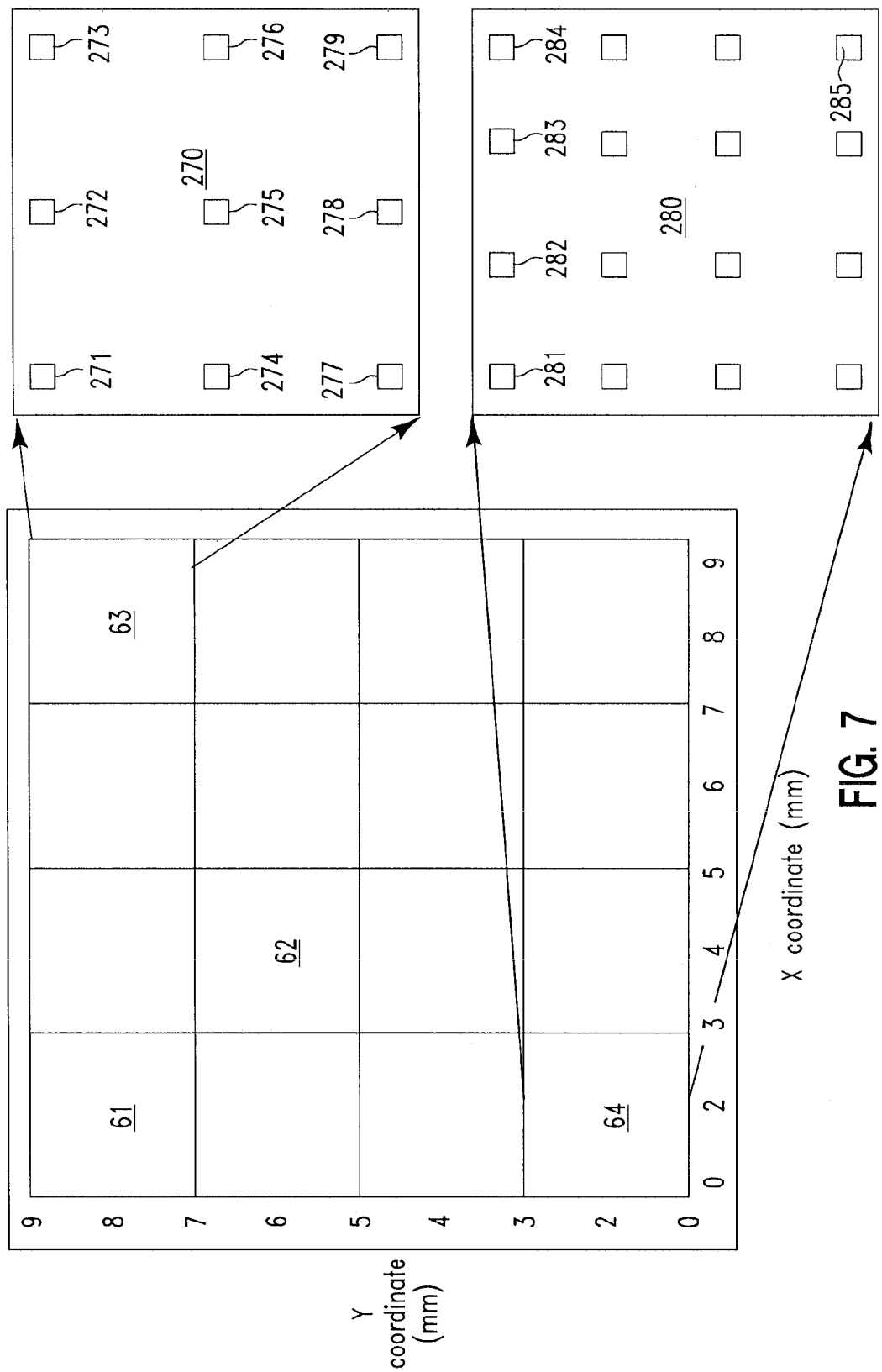
FIG. 7 illustrates how each mask subregion of FIG. 6 is configured to achieve a specified transmissivity, in accordance with embodiments of the present invention.

FIG. 7 illustrates how each mask subregion of FIG. 6 is configured to achieve a specified transmissivity, in accordance with embodiments of the present invention. The specified transmissivity is the transmissivity calculated via Equation (1). Each mask subregion independently comprises a contiguous subregion portion and K non-contiguous subregion portions distributed within the contiguous subregion portion, wherein K is mask subregion independent (i.e., K may differ in different mask subregions of each mask region) and K is at least 1. For example, mask subregion 63 in FIG. 6 comprises a contiguous subregion portion 270 and 9 non-contiguous subregions (271-279) distributed within the contiguous subregion portion 270 (i.e., K=9). Similarly, mask subregion 64 in FIG. 6 comprises a contiguous subregion portion 280 and 16 non-contiguous subregions (281-284, . . . , 285) distributed within the contiguous subregion portion 280 (i.e., K=16). The contiguous subregion portion is about totally transparent to the first radiation 31. The non-contiguous subregion portions are about totally reflective (e.g., chrome) or absorptive (i.e., partially or fully absorptive; e.g., carbon is absorptive) with respect to the first radiation 31. If the non-contiguous subregion portions are absorptive, then the absorbed radiation by the absorptive non-contiguous subregion portions will heat the mask 20. If the non-contiguous subregion portions are about totally reflective, then the first radiation 31 will not cause any heating of the mask 20.

Although the non-contiguous subregion portions 271-279 are shown in FIG. 7 as being uniformly distributed within the contiguous subregion 270, the non-contiguous subregions may be nonuniformly distributed within the contiguous subregion.

Although the non-contiguous subregion portions 271-279 are shown in FIG. 7 as having a square cross-sectional shape, the non-contiguous subregion portions may have any cross-sectional shape (e.g., square, rectangular, triangular, pentagonal, hexagonal, circular, elliptical, a non-symmetrical shape, an irregular shape, etc.)

Although the non-contiguous subregion portions 271-279 are shown in FIG. 7 as having a same cross-sectional shape, the non-contiguous subregion portions may have different cross-sectional shapes with respect to each other.

Although the non-contiguous subregion portions 271-279 are shown in FIG. 7 as having a same cross-sectional area, the non-contiguous subregion portions may have different cross-sectional areas with respect to each other.

In FIG. 7, each non-contiguous subregion portion has a geometrical shape and a cross-sectional area adapted to be exposed to the first radiation 31, wherein the transmissivity $T_M(n)$ in mask subregion n of the N mask subregions in each mask region is a spatially averaged transmissivity over the contiguous subregion portion and the K non-contiguous subregion portions in mask subregion n for n=1, 2, . . . , N. An example of such a spatial average for a mask region having a contiguous subregion portion and K identical non-contiguous subregion portions, $T_{AVE}=[(A_{REG}-K*A_{NC})T_C+K*A_{NC}*T_{NC}]/A_{REG}$, wherein $T_{AVE}$=average transmissivity for the mask region, $T_C$=transmissivity of the contiguous subregion portion, $T_{NC}$=transmissivity of each non-contiguous subregion portion, $A_{REG}$=cross-sectional area of the mask subregion, and $A_{NC}$=cross-sectional area of each non-contiguous subregion portion.

As described supra, FIG. 1 depicts embodiments in which the radiation source 21 emits the first radiation 31 which, after being transformed into the second radiation 32 by the mask 20, is incident upon every substrate region in the substrate 10. If the substrate 10 is a semiconductor wafer and the substrate regions are semiconductor chip regions, then the second radiation 32 is simultaneously incident upon every semiconductor chip region in the semiconductor wafer in FIG. 1. However, the present invention also includes embodiments in which the radiation from a radiation source (e.g., a laser), after being transformed by a transmissive mask, is incident serially (timewise) upon groups of substrate regions of the substrate 10 as described infra in conjunction with FIG. 8.

Figure 8:
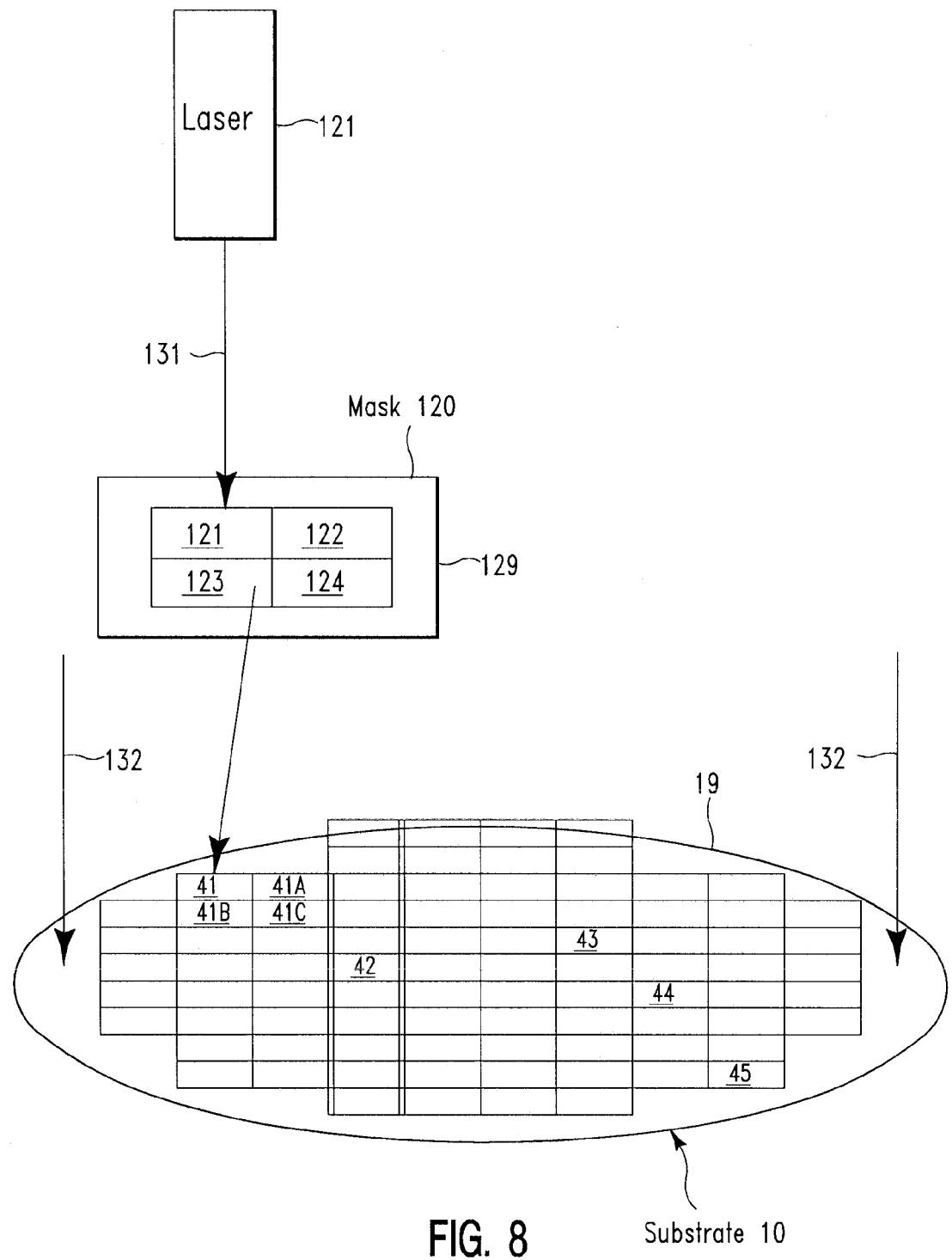
FIG. 8 is a diagram depicting propagation of a first radiation from a laser, through a mask, and incident upon a substrate as second radiation, in accordance with embodiments of the present invention.

FIG. 8 is a diagram depicting propagation of first radiation 131 from a laser 121, through a mask 120, and incident upon a substrate 10 as second radiation 132, in accordance with embodiments of the present invention. The diagram of FIG. 8 differs from the diagram of FIG. 1 in two respects. In a first respect, that the laser 121 of FIG. 8 represents a particular embodiment of the radiation source 21 of FIG. 1. In a second respect, the mask 120 of FIG. 8 comprises only 4 mask regions (namely mask regions 121-124) in contrast with 82 mask regions of the mask 20 of FIG. 1, even though the substrate 10 comprises the same 82 substrate regions in both FIG. 1 and FIG. 8.

In FIG. 8, the first radiation 131 is spatially uniform with respect to the spatial position on the top surface 129 of the mask 120. The first radiation 131 is incident upon a top surface 129 of the mask 120 and is partially reflected and/or partially absorbed while passing through the mask 210, in a manner that varies spatially with position on the top surface 129 of the mask 120. The portion of the first radiation 131 that passes through the mask 120 is subsequently incident upon a top surface 19 of the substrate 10 and is referred to as the second radiation 132. The laser 121 emits the first radiation 131 at just one discrete wavelength to effectuate laser annealing of the substrate 10.

The 4 mask regions of the mask 120 is used to successively expose corresponding groups of 4 substrate regions of the substrate 10 to the second radiation 132 the mask 120 and the substrate 10 are moved relative to each other; i.e., as the mask 120 is stepped (i.e., successively translated) relative to the substrate 10 in a direction parallel to the surface 19 of the substrate 10, or equivalently as the substrate 10 is stepped relative to the mask 120 in a direction parallel to the surface 129 of the mask 120, until all substrate regions of the substrate 10 have been exposed to the second radiation 132. As each group of substrate regions is exposed to the second radiation 132, the remaining groups of substrate regions are blocked from the second radiation 132. For example in one exposure, the substrate regions 41, 41A, 41B, 41C, form a first group of substrate regions while the remaining groups of substrate regions are blocked from the second radiation 132. The substrate regions 41, 41A, 41B, 41C in the first group are simultaneously exposed to the second radiation 132 as a consequence of the first radiation 131 passing through the mask regions 121, 122, 123, 124, respectively, while all other substrate regions in the substrate 10 are blocked from the second radiation 132. Similarly, the substrate regions of each such group of 4 substrate regions in the substrate 10 are simultaneously exposed to the second radiation 132 as a consequence of the first radiation 131 passing through the mask regions 121, 122, 123, 124, respectively, while all other substrate regions in the substrate 10 are blocked from the second radiation 132.

Aside from the successive exposure of groups of substrate regions to the second radiation 132 of FIG. 8, as compared with the simultaneous exposure of all substrate regions to the second radiation 32 of FIG. 1, the methodology described supra in conjunction with FIGS. 2-7 for the design, formation, and use of the mask 20 of FIG. 1 is applicable to the design, formation, and use of the mask 120 of FIG. 8, because said methodology relates to each mask region and associated substrate region individually, irrespective of how many such mask regions are comprised by the mask 20 and irrespective of how the substrate regions are grouped within the substrate 10 for the purpose of being exposed to the second radiation 132.

The method for designing and forming a mask, in accordance with the embodiments of FIGS. 1 and 8 may be formulated generally as follows. A specified target transmittance of a surface portion of a top surface of a substrate (e.g., the substrate 10) with respect to a first radiation (e.g., the first radiation 31/131) propagated from a radiation source (e.g., the first radiation source 21/121) is provided or received. The first radiation is adapted to be transmitted into the substrate through the surface portion after the propagated first radiation has been transmitted with spatial selectivity through a mask (e.g., the mask 20/120) disposed between the radiation source and the surface portion. The first radiation after having passed through the mask is denoted as a second radiation (e.g., the second radiation 32/132). The surface portion is characterized by a spatially varying reflectance with respect to the second radiation 32/132 incident thereon. The mask is formed or designed as having a spatially varying transmissivity with respect to the first radiation, wherein an actual transmittance of the surface portion with respect to the first radiation matches the specified target transmittance to within a specified tolerance.

In one embodiment, the first radiation is monochromatic. In one embodiment, the first radiation comprises a continuous distribution of wavelengths.

The substrate may comprise L substrate regions such that L is at least 1. The L substrate regions each consist of G groups of substrate regions, each group consisting of M substrate regions such that G is at least 1, M is at least 1, and L=G*M. Each substrate region of the L substrate regions may have about a same geometric structure and about a same material composition. Each substrate region of each group of M substrate regions may comprise N substrate subregions denoted as substrate subregions 1, 2, . . . , N such N is at least 2. A top surface of substrate subregion n of each substrate region may be comprised by the surface portion and has a reflectance R(n) with respect to the second radiation for n=1, 2, . . . N. The specified target transmittance for subregion n of each substrate region with respect to the first radiation is denoted as $T_S(n)$. The mask may comprise M mask regions, each mask region having about a same geometric structure and a same material composition, said M mask regions respectively corresponding to M substrate regions on a one-to-one basis for each group of M substrate regions of the G groups. Each mask region may comprise N mask subregions denoted as mask subregion 1, 2, . . . , N, said N mask subregions of each mask region respectively corresponding to the N substrate subregions of a corresponding substrate region of the M substrate regions for each group of M substrate regions of the G groups. Mask subregion n of each mask region has a transmissivity $T_M(n)$ with respect to the first radiation such that $T_M(n)*(1-R(n))$ is about equal to $T_S(n)$ for n=1, 2, . . . , N. In the example of FIG. 8, M=4.

In one embodiment, $T_S(n)$ is independent of n. In one embodiment, $T_S(n)$ is different for at least two values of n.

In one embodiment, L=1. In one embodiment, L is at least 2.

In one embodiment, G=1. In one embodiment, G is at least 2,

In one embodiment, the substrate is a semiconductor wafer, wherein the same material composition of each substrate region of the L substrate regions comprises a semiconductor material.

In one embodiment, each mask subregion of each mask region independently comprises a contiguous subregion portion and K non-contiguous subregion portions distributed within the contiguous subregion such that K is at least 1. The contiguous subregion portion of each mask subregion of each mask region may be about totally transparent to the first radiation incident upon the M mask regions. The K non-contiguous subregion portions of each mask subregion of each mask region may be about totally reflective or are absorptive with respect to the first radiation. Each non-contiguous subregion portion of the K non-contiguous subregion portions of a first mask subregion of the N mask subregions of a first mask region of the M mask regions may independently have a cross-sectional shape and a cross-sectional surface area adapted to be exposed to the first radiation. The transmissivity $T_M(n)$ in mask subregion n of the N mask subregions in each mask region may be a spatially averaged transmissivity over the contiguous subregion portion and the K non-contiguous subregion portions in mask subregion n for n=1, 2, . . . , N.

In one embodiment, the K non-contiguous subregion portions of each mask subregion of each mask region are about totally reflective with respect to the first radiation, and each such mask subregion of each mask region may comprise chrome.

In one embodiment, each such mask subregion of each mask region may be absorptive with respect to the first radiation, and each such mask subregion of each mask region may comprise carbon.

In one embodiment, each non-contiguous subregion portion the K non-contiguous subregion portions of a first mask subregion of the N mask subregions may independently have a cross-sectional shape and a cross-sectional surface area adapted to be exposed to the first radiation.

In one embodiment, each mask subregion of the N mask subregions of each mask independently consists of the contiguous subregion and the K non-contiguous subregion portions.

In one embodiment, K is at least 3, wherein the K non-contiguous subregion portions of a first mask subregion of a first mask region of the M mask regions are uniformly distributed within the contiguous subregion portion of the first mask subregion.

In one embodiment, K is at least 3, and wherein the K non-contiguous subregion portions of a first mask subregion of a first mask region of the M mask regions are non-uniformly distributed within the contiguous subregion portion of the first mask subregion.

In one embodiment, K is at least 3, and the K non-contiguous subregion portions of a first mask subregion of a first mask region of the M mask regions are randomly distributed within the contiguous subregion portion of the first mask subregion.

In one embodiment, the top surfaces of the N mask subregions of each mask region of the M mask regions are distributed in accordance with a two-dimensional rectangular grid distribution with respect to mutually orthogonal X and Y directions.

In one embodiment, the grid distribution is uniform in both the X and Y directions. In one embodiment, the grid distribution is uniform in the X direction and nonuniform in the Y direction. In one embodiment, the grid distribution is nonuniform in both the X and Y directions.

After the mask has been formed and/or provided, the first radiation from the radiation source may be propagated through a surface portion of a top surface of the substrate after the propagated first radiation has been transmitted with spatial selectivity through the mask disposed between the radiation source and the surface portion, said first radiation after having passed through the mask being denoted as a second radiation, said surface portion characterized by a spatially varying reflectance with respect to the second radiation incident thereon, said mask having a spatially varying transmissivity with respect to the first radiation, wherein an actual transmittance of the surface portion with respect to the first radiation matches a prior specified target transmittance of the surface portion with respect to the first radiation to within a specified tolerance.

In one embodiment, the substrate is a semiconductor wafer, wherein the same material composition of each substrate region of the L substrate regions comprises a semiconductor material, wherein G=1 and L=M, and wherein said propagating results in the second radiation being simultaneously incident on each region of the L substrate regions so as to effectuate a rapid thermal anneal of the L substrate regions.

In one embodiment, the substrate is a semiconductor wafer, wherein the same material composition of each substrate region of the L substrate regions comprises a semiconductor material, wherein G exceeds 1, and wherein said propagating results in the second radiation being simultaneously incident on the M substrate regions of a first group of the G groups so as to effectuate a laser anneal of the M substrate regions of the first group by the second radiation while the remaining regions of the L substrate regions are blocked from the second radiation. The mask may be sequentially stepped relative to the substrate to cause serial irradiation of the remaining groups of substrate regions in the substrate to similarly effectuate a laser anneal of the M substrate regions in each group.

In one embodiment, prior to said propagating the first radiation, the substrate is irradiated with an initial radiation from an initial radiation source to anneal the substrate without passing the initial radiation through an intervening mask disposed between the initial radiation source and the substrate.

Figure 9:
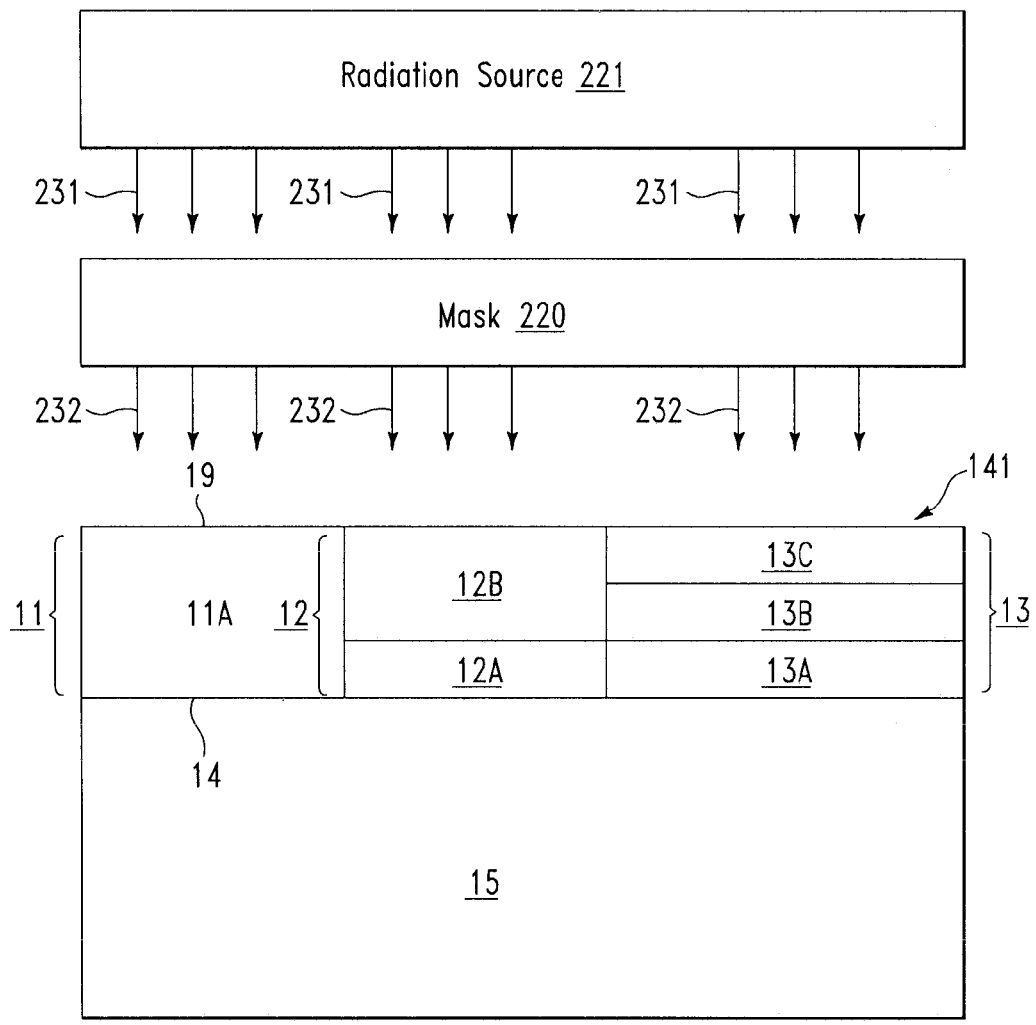
FIG. 9 is a front cross-sectional view of a substrate region of the substrate of FIG. 1 or FIG. 8, in accordance with embodiments of the present invention.

FIG. 9 is a front cross-sectional view of a substrate region 141 of the substrate 10 of FIG. 1 or FIG. 8, in accordance with embodiments of the present invention. In FIG. 9, the substrate region 141 is exposed to the radiation source 221 for propagating the first radiation 231 through the mask 220 to irradiate top surface 19 the substrate 10 with the second radiation 232. The substrate region 141 of FIG. 9 represents any substrate region (41, 42, 43, 44, 45, etc.) of FIG. 1 or FIG. 8. If FIG. 1 is represented in FIG. 9, then the radiation source 221 of FIG. 9 represents the radiation source 21 of FIG. 1, the mask 220 of FIG. 9 represents the mask 20 of FIG. 1, the first radiation 231 of FIG. 9 represents the first radiation 31 of FIG. 1, and the second radiation 232 of FIG. 9 represents the second radiation 32 of FIG. 1. If FIG. 8 is represented in FIG. 9, then the radiation source 221 of FIG. 9 represents the radiation source 121 of FIG. 8, the mask 220 of FIG. 9 represents the mask 120 of FIG. 8, the first radiation 231 of FIG. 9 represents the first radiation 131 of FIG. 8, and the second radiation 232 of FIG. 9 represents the second radiation 132 of FIG. 8.

In FIG. 9, the substrate region 141 comprises a base layer 15 and layered stacks 11, 12, and 13 on and in direct mechanical contact with the base layer 15. The base layer 15 may comprise comprises a dielectric material, a semiconductor material, a metal, an alloy, etc. For example, the base layer 15 may be a semiconductor layer (e.g., a portion of a semiconductor wafer) comprising a semiconductor material (e.g., single crystal silicon, polysilicon, germanium, etc.—doped or undoped). The substrate region 141 may terminate with the base layer 15. Alternatively the base layer 15 may be disposed between the stacks 111-13 and one or more additional layers of the substrate.

Stack 11 comprises a layer 11A of semiconductor material. Stack 12 comprises dielectric layers 12A and 12B. Stack 13 comprises dielectric layers 13A, 13B, and 13C. Each dielectric layer 12A, 12B, 13A, 13B, and 13C independently comprises a dielectric material.

Generally, a plurality of stacks is disposed on, and in direct mechanical contact with, the base layer 15. Each stack comprises one or more layers. Each layer of each stack may independently comprise a dielectric material (e.g., silicon dioxide, silicon nitride, aluminum oxide, high-k dielectric, low-k dielectric), a semiconductor material (e.g., single crystal silicon, polysilicon, germanium, etc.—doped or undoped), a metal (e.g., tungsten), an alloy (e.g., tungsten silicide), or a combination thereof. Thus, each stack has a first layer of the one or more dielectric layers that is on and in direct mechanical contact with the base layer 15. For example in FIG. 1, the first layers 11A, 12A, and 13A of dielectric stacks 11, 12, and 13, respectively, are on and in direct mechanical contact with the base layer 15 at the interfacial surface 14.

Figure 10:
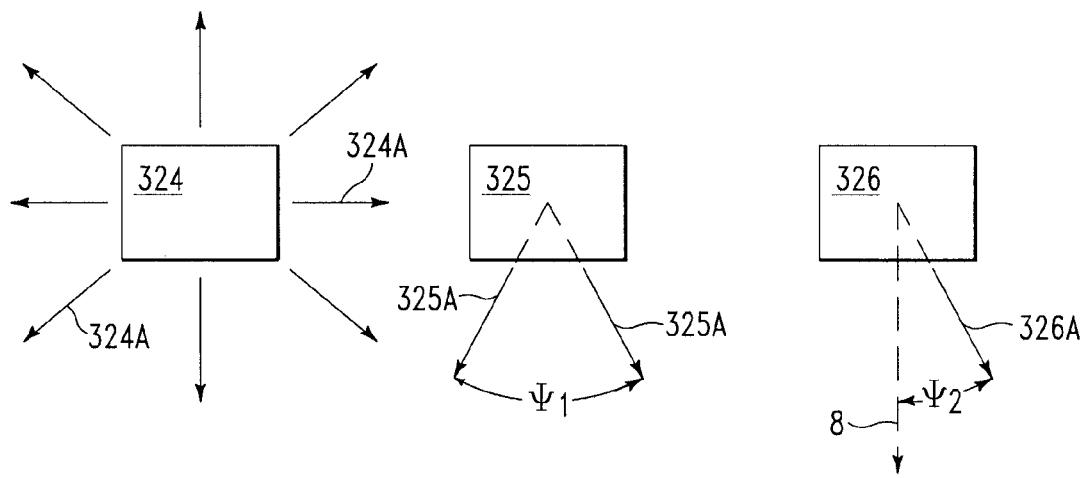
FIG. 10 depicts sources of electromagnetic radiation and their angular distributions, in accordance with embodiments of the present invention.

The radiation source 221 in FIG. 9 may emit radiation in any angular distribution. To illustrate, FIG. 10 depicts radiation sources 324, 325, and 326 of electromagnetic radiation and their angular distributions, in accordance with embodiments of the present invention. Sources 324, 325, and 326 each represent an embodiment of source 221 of FIG. 9. Source 324 emits radiation 324A in all directions. Source 325 emits radiation 325A within a limited solid angular range $\Psi_1$. Source 326 emits radiation 326A unidirectionally in a direction described by a solid angle $\Psi_2$ with respect to the reference direction 8.

If the source 221 of FIG. 9 emits radiation over a finite range of directions, the emitted radiation may be isotropic or anisotropic within the finite range of directions. In addition, the source 221 may each be monochromatic or polychromatic with respect to the wavelength λ of the radiation. Generally, the power distribution Q(λ,Ψ) of the radiation emitted from the source 221, as a function of wavelength λ and solid angular direction Ψ, may be of the form Q(λ, Ψ)=$Q_0$* $Q_1$(λ, Ψ) subject to a normalization condition of ∫∫ dΨ dλ $Q_1$(λ,Ψ)=1. With the preceding normalization, $Q_0$ denotes the power generated (e.g., in units of joule/sec) by the source 221. If the preceding normalization is not operative, then $Q_0$ is proportional to the power generated by the source 221. In one embodiment, $Q_1$(λ,Ψ) is separable into a product of a function $Q_{11}$(λ) of λ and a function $Q_{12}$(Ψ) of Ψ (i.e., $Q_1$(λ,Ψ)= $Q_{11}$(λ)*$Q_{12}$(Ψ)). For a monochromatic source having wavelength $λ_0$, $Q_{11}$(λ) may be expressed in terms of a delta function; e.g., $Q_{11}$(λ)~δ(λ−$λ_0$).

Returning to FIG. 9, the electromagnetic radiation emitted by the source 221 is incident upon substrate region 141 of the substrate 10 in the direction of energy flow with an associated energy flux P. If the radiation in the direction of energy flow is projected onto a direction that is normal to the top surface 19 of the substrate, then the resultant energy flux P normally directed into the stack is varies along the surface 19 in accordance with the transmissive properties of the mask 220 as explained supra. The energy flux into the stack is in units of power per unit surface area of the top surface 19 of the stack, which is equivalent to units of energy per unit time per unit surface area.

Figure 11:
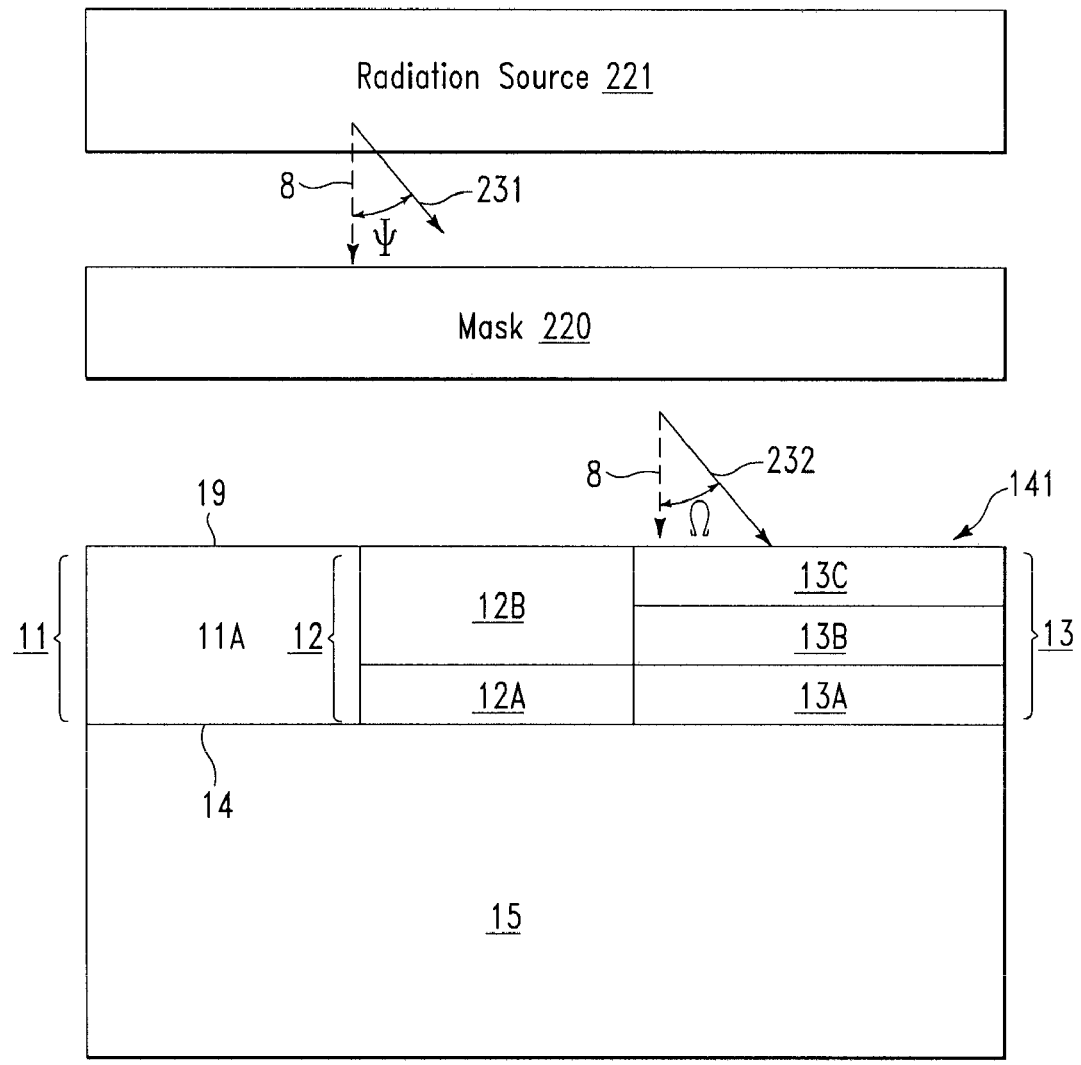
FIG. 11 depicts the substrate of FIG. 9 with radiation from a source incident on a surface of a substrate region of the substrate in an angular distribution characterized by a solid angle, in accordance with embodiments of the present invention.

FIG. 11 depicts the substrate region 141 of the substrate 10 of FIG. 9 with first radiation 231 from the radiation source 221 incident on surface 19 of the substrate region 141 as second radiation 232 after passing through the mask 220, in accordance with embodiments of the present invention. The source 221 emits the first radiation 231 in an angular distribution in terms of the solid angular direction Ψ with respect to the reference direction 8, and the radiation 232 is incident on the substrate region 141 in an angular distribution with respect to the solid angular direction Ω with respect to the reference direction 8. If the source 221 emits radiation according to the power distribution Q(λ,Ψ), then the energy flux component normally incident upon the substrate region 141 is governed by an energy flux P (as described supra) and a distribution U(λ,Ω) in wavelength λ and solid angle Ω. Given the power distribution $Q_0$*$Q_1$(λ,Ψ) of the source as described supra, the energy flux P of radiation incident on the mask 220, and the distribution U(λ,Ω) in wavelength λ and in solid angular direction Ω, may be deduced from $Q_0$ and $Q_1$(λ, Ψ) by a person of ordinary skill in the art.

Figure 12:
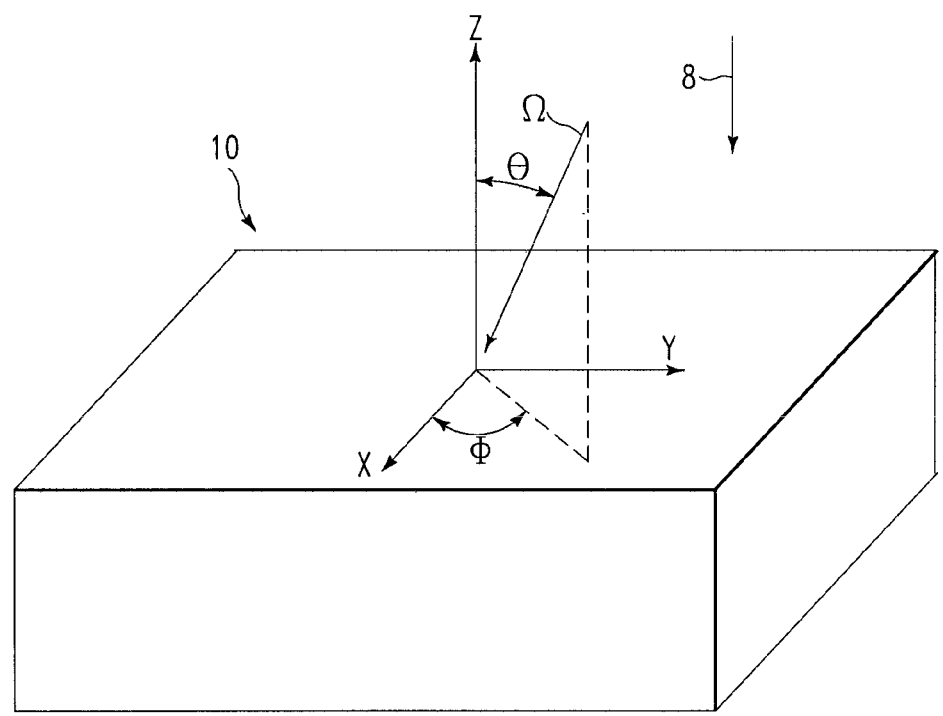
FIG. 12 illustrates that the solid angle of FIG. 11 is characterized by a polar angle and an azimuthal angle, in accordance with embodiments of the present invention.

FIG. 12 illustrates that the solid angle Ω of FIG. 3 is characterized by a polar angle θ and an azimuthal angle Φ with respect to an XYZ orthogonal coordinate system as shown, in accordance with embodiments of the present invention. The solid angle Ψ for the radiation emitted from the source 221 in FIG. 11 is similarly characterized by its polar angle and azimuthal angle (not shown).

Figure 13:
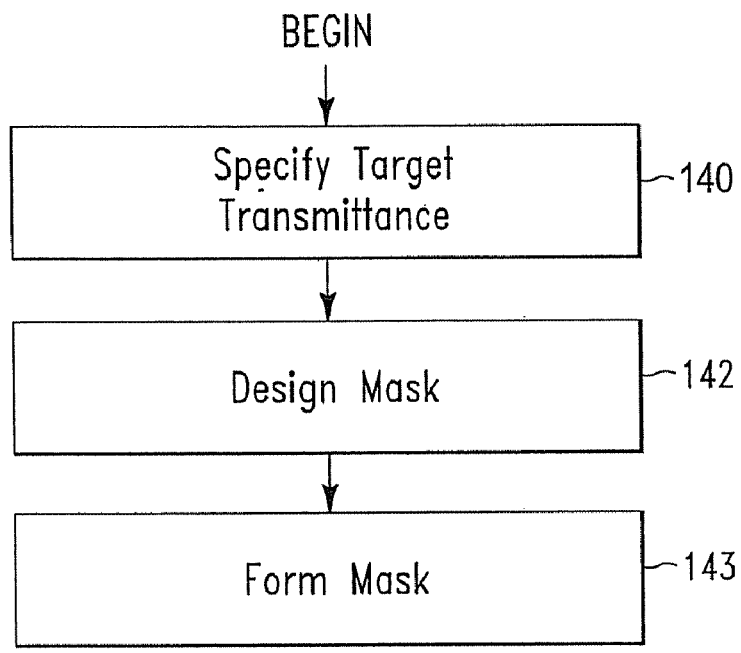
FIG. 13 is a flow chart of a method for designing and forming a mask, in accordance with embodiments of the present invention.

FIG. 13 is a flow chart of a method for establishing a mask, in accordance with embodiments of the present invention. The method of FIG. 13 comprises steps 140, 142, and 143, which may be understood with reference to FIGS. 1 and 8.

Step 140 specifies a target transmittance ($T_S$) of a surface portion of the top surface 19 of the substrate 10 with respect to the first radiation (31/131) propagated from a radiation source (21/121) and transmitted through the mask (20/120) with spatial selectivity in accordance with a spatially varying transmissivity ($T_M$) of the mask with respect to the first radiation. The mask is disposed between the radiation source (21/121) and a surface portion of a top surface 19 of the substrate 10. The second radiation (32/132) is transmitted into the substrate 10 through the surface portion after the propagated first radiation has been transmitted through the mask (20/120). The surface portion comprises the portion of the top surface 19 on which the second radiation (32/132) is incident. The surface portion is characterized by a spatially varying reflectance (R) with respect to the second radiation (32/132) incident thereon. A portion of the second radiation (32/132) is transmitted into the substrate 10 at the surface portion. In one embodiment, the specified target transmittance is about constant over the surface portion. In one embodiment, the specified target transmittance is spatially varying over the surface portion (i.e., different in at least two substrate regions of the surface portion).

Steps 142-143 collectively describe creating the mask (i.e., establishing the mask by designing the mask, forming the mask, or both designing and forming the mask)

Step 142 designs the mask (20/120). The designed mask (20/120) has a spatially varying transmissivity with respect to the first radiation (31/131), wherein an actual transmittance of the surface portion with respect to the first radiation (31/131) is about equal to the specified target transmittance of step 140 (i.e., the actual transmittance with respect to the first radiation (31/131) matches the specified target transmittance to within a specified tolerance); i.e., $T_M$*(1−R) is about equal to $T_S$. In one embodiment, the spatially varying transmissivity of the mask (20/120) with respect to the first radiation (31/131) relates to the spatially varying transmissivity for each mask region of the mask (20/120), as discussed supra in conjunction with FIGS. 4-6.

Step 143 forms the mask (20/120) based on the design of the mask (20/120) design in step 142.

Figure 14:
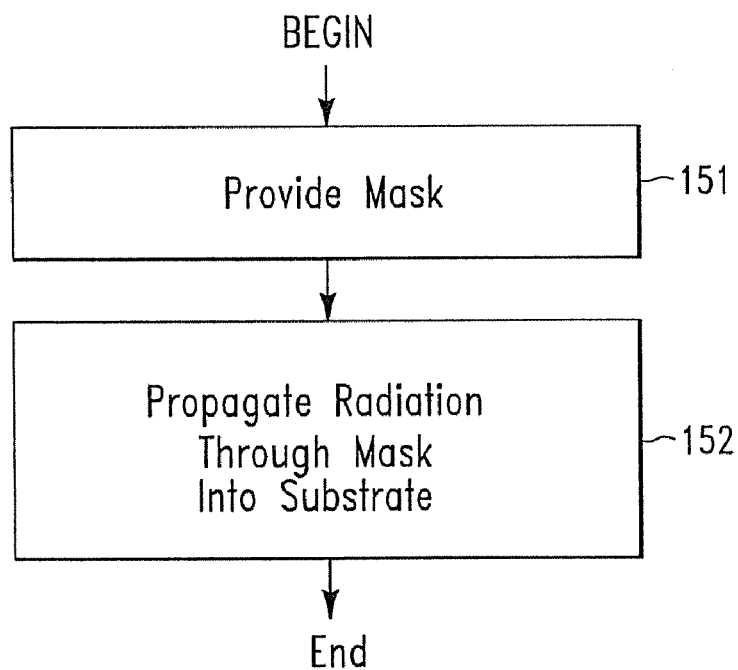
FIG. 14 is a flow chart of a method for irradiating a substrate through use of the mask of FIG. 1, in accordance with embodiments of the present invention.

FIG. 14 is a flow chart of a method for irradiating a substrate through use of the mask 20 of FIG. 1, in accordance with embodiments of the present invention. The method of FIG. 14 comprises steps 151-152.

Step 151 provides the mask 20 of FIG. 1 formed in accordance with the method described in the flow chart of FIG. 13.

Step 152 propagates first radiation 31 from the radiation source 21 into the substrate 10 through a surface portion of a top surface of the substrate 10 after the propagated first radiation 31 has been transmitted with spatial selectivity through a mask 20 disposed between the radiation source 21 and the surface portion. After passing through the mask 20, the first radiation 31 has been transformed to the second radiation 32. The surface portion of the substrate 10 is characterized by a spatially varying reflectance with respect to the second radiation 32 incident thereon. The mask 20 has a spatially varying transmissivity with respect to the first radiation 31, wherein an actual transmittance of the surface portion with respect to the first radiation 31 is about equal to a prior specified target transmittance of the surface portion with respect to the first radiation 31 (i.e., the actual transmittance matches the specified target transmittance to within a specified tolerance).

Figure 15:
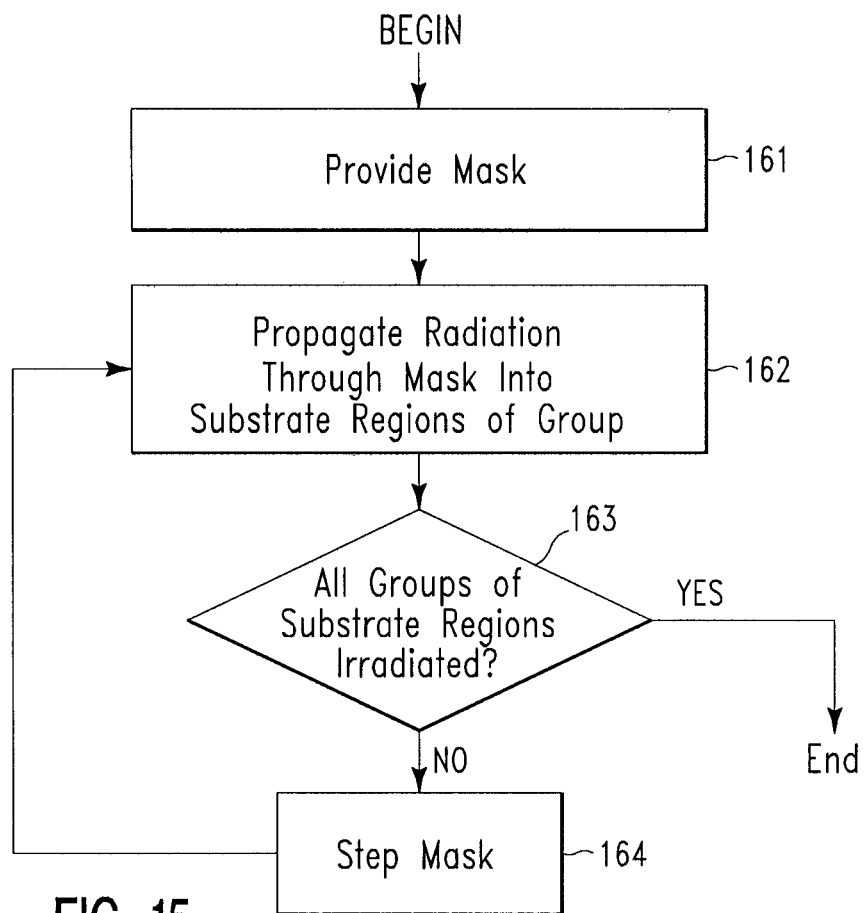
FIG. 15 is a flow chart of a method for irradiating a substrate through use of the mask of FIG. 8, in accordance with embodiments of the present invention.

FIG. 15 is a flow chart of a method for irradiating a substrate through use of the mask 120 of FIG. 8, in accordance with embodiments of the present invention. The method of FIG. 15 comprises steps 161-164.

Step 161 provides the mask 120 of FIG. 8 formed in accordance with the method described in the flow chart of FIG. 13.

Step 162 propagates first radiation 131 from the radiation source 121 into the substrate 10 through a surface portion of a top surface 19 of the substrate 10 after the propagated first radiation 131 has been transmitted with spatial selectivity through a mask 120 disposed between the radiation source 121 and the surface portion. After passing through the mask 120, the first radiation 131 has been transformed to the second radiation 132. The surface portion 19 exposes one and only one group of substrate regions (e.g., the group of substrate regions 41, 41A, 41B, 41C in FIG. 8) to the second radiation 132 as a consequence of the first radiation 131 passing through the mask regions, while all other substrate regions in the substrate 10 (other than the substrate regions in the group being currently exposed) are blocked from the second radiation 132. The surface portion of the substrate 10 is characterized by a spatially varying reflectance with respect to the second radiation 132 incident on the group being currently exposed. The mask 120 has a spatially varying transmissivity with respect to the first radiation 131, wherein an actual transmittance of the surface portion with respect to the first radiation 131 (for the group being currently exposed) is about equal to a prior specified target transmittance of the surface portion with respect to the first radiation 131 (i.e., the actual transmittance matches the specified target transmittance to within a specified tolerance).

Step 163 determines whether all groups of substrate region in the substrate 10 have been exposed to the second radiation 132. If step 163 determines that all groups of substrate region in the substrate 10 have been exposed to the second radiation 132 then the process of FIG. 15 ends. If step 163 determines that all groups of substrate region in the substrate 10 have not been exposed to the second radiation 132 then step 164 is next executed.

Step 164 steps the mask 120 relative to the substrate 10, or equivalently steps the substrate 10 relative to the mask 120, in a direction parallel to the surface 129 of the mask 120, followed by looping back to step 162 to expose a next group of substrate regions to the second radiation 132.

Figure 16:
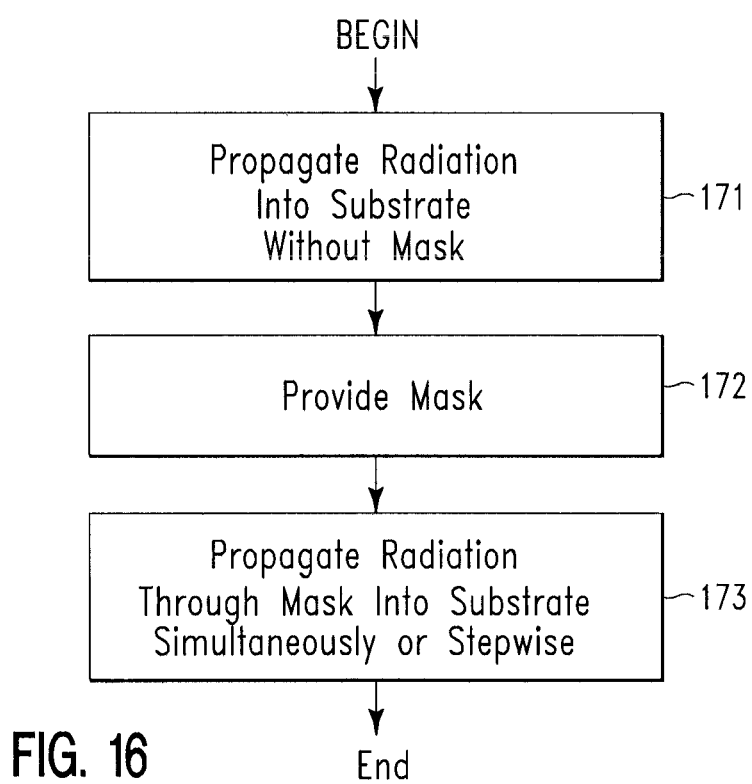
FIG. 16 is a flow chart of a method for re-irradiating a substrate through use of a mask after the substrate has been previously irradiated without a mask, in accordance with embodiments of the present invention.

FIG. 16 is a flow chart of a method for re-irradiating a substrate through use of a mask after the substrate has been previously irradiated without a mask, in accordance with embodiments of the present invention. The method of FIG. 16 comprises steps 171-173, which may be understood with reference to FIGS. 1 and 8.

Step 171 exposes all substrate regions of the substrate 10 to an initial radiation from an initial radiation source to anneal the substrate without passing the initial radiation through an intervening mask disposed between the initial radiation source and the substrate.

Step 172 provides the mask 20 of FIG. 1, or mask 120 of FIG. 3, formed in accordance with the method described in the flow chart of FIG. 13.

Step 173 propagates radiation through the mask provided in step 172 to irradiate the substrate regions simultaneously (as in step 152 of FIG. 14) or stepwise (as in steps 162-164 of FIG. 15.

2. Determination of Transmission Coefficients and Reflectivity

Let the energy flux incident on the substrate from a given radiation source, after having passed through a mask as described supra in conjunction with FIGS. 1 and 8, be described as a distribution $U(\lambda,\Omega)$ in wavelength $\lambda$ and solid angle $\Omega$. Let $T(\lambda,\Omega)$ denote the transmission coefficient of a stack for a given wavelength $\lambda$ and solid angle $\Omega$. $T(\lambda,\Omega)$ may be determined experimentally by experimental techniques known to a person of ordinary skill in the art. Alternatively, $T(\lambda,\Omega)$ may be calculated for each specified combination of $\lambda$ and $\Omega$, as will be described infra. After $T(\lambda,\Omega)$ is determined, either experimentally or by calculation, the integrated transmission coefficient T for the stack may be calculated via $$T = \iint d\Omega d\lambda U(\lambda,\Omega) T(\lambda,\Omega) / \iint d\Omega d\lambda U(\lambda,\Omega) \quad (2)$$

The integrations in Equation (2) are performed over the range of wavelength $\lambda$ and solid angle $\Omega$ for which $U(\lambda,\Omega)$ is defined. The role of $U(\lambda,\Omega)$ in Equation (2) is that of a weighting function reflecting how the incident radiation from the given source is distributed in both wavelength $\lambda$ and solid angle $\Omega$.

The transmission coefficient T in Equation (2) is equivalent to the transmittance of the substrate 10 with respect to the second radiation (32/132) described supra in conjunction with FIGS. 1 and 8. As stated supra, T=1−R, wherein R is the reflectance of the substrate 10 with respect to the second radiation (32/132)

Alternatively, T for each stack receiving radiation from the given radiation source may be determined experimentally by experimental techniques known to a person of ordinary skill in the art.

$T(\lambda,\Omega)$ may be computed for a given combination of $\lambda$ and $\Omega$, wherein $\Omega$e such that the radiation incident upon the substrate 10 may be normal or non-normal to the substrate 10. In Section 2.1, an algorithm for calculating $T(\lambda,\Omega)$ will be described under the assumption that the radiation is normally incident upon the substrate. In Section 2.2, an algorithm for calculating $T(\lambda,\Omega)$ will be described for any solid angle of incidence $\Omega$.

2.1 Normal Incidence of Radiation $T(\lambda,\Omega)$ may be computed for a given combination of $\lambda$ and $\Omega$ under the assumption that the radiation is normally incident upon the substrate. For normal incidence of the radiation at a specified wavelength $\lambda$, FIG. 17 depicts the incident radiation 79 propagating through the layers of a stack in the substrate 10, in accordance with embodiments of the present invention. In FIG. 17, the stack comprises N−1 layers denoted as layers 1, 2, . . . , N−1. Layer 0 characterizes the medium from which the radiation 79 enters the stack at top surface 19. Layer N represents the base layer 15 into which the radiation is transmitted from layer N−1 of the stack at interfacial layer 14. In FIG. 17, $n_m$ denotes the index of refraction of layer m, $z_m$ denotes the coordinate value in the direction 17 at the interface between layer m and layer m+1 (m=0, 1, . . . , N−1) subject to $z_0$=0. $F_m$ denotes the forward electric field complex amplitude in layer m for the radiation propagating in the direction 17. $R_m$ denotes the reflected electric field complex amplitude in layer m for the reflected radiation propagating in the direction 18 which is opposite the direction 17 (m=0, 1, . . . , N). Physically, the reflected components $R_m$ are generated by the discontinuity in index of refraction at the interfaces (i.e., between layers m−1 and m for m=1, 2, . . . , N).

Continuity of the electric field and its derivative at the interface between layers m−1 and m (m=1, 2, . . . , N) respectively results in the following equations:

$$F_{m-1}\exp(ik_{m-1}z_{m-1}) + R_{m-1}\exp(-ik_{m-1}z_{m-1}) = \\ F_m\exp(ik_m z_m) + R_m\exp(-ik_m z_m) \quad (3)$$

$$k_{m-1}F_{m-1}\exp(ik_{m-1}z_{m-1}) - k_{m-1}R_{m-1}\exp(-ik_{m-1}z_{m-1}) = \\ k_m F_m\exp(ik_m z_m) - k_m R_m\exp(-ik_m z_m) \quad (4)$$

where $k_m=1/(2\pi n_m \lambda)$. Note that "i" in $\exp(\pm ik_m z_m)$ denote the square root of −1 and should not be confused with the use of "i" as a subscript in the description of the present invention herein.

Exemplary boundary conditions are $F_0$=1 and $R_N$=0. For the preceding exemplary boundary conditions, Equations (3)-(4) provide 2N linear equations and there are 2N unknowns ($F_1, \ldots, F_N, R_0, \ldots, R_{N-1}$) which may be solved by any method known to a person of ordinary skill in the art (e.g., matrix inversion).

The resultant transmission coefficient T is calculated as $T = (1 - |R_0|^2)/|F_0|^2$; i.e. or $T = 1 - |R_0|^2$ for the assumed $F_0 = 1$ with the preceding exemplary boundary conditions. Note that the assumption of $F_0 = 1$ is arbitrary and any numerical value could have been chosen for $F_0$, since the transmission coefficient is the fraction of transmitted energy flux and therefore does not depend on the magnitude of $F_0$.

The preceding exemplary boundary condition of $R_N = 0$ may occur if all of the radiation entering layer N through the stack shown in FIG. 17 is absorbed in layer N. Alternative embodiments may be characterized by $R_N \neq 0$, which can be treated in a similar manner as with the $R_N = 0$ embodiment described supra, by setting the reflection coefficient to zero in a layer N'>N in which no reflections occur and adding additional equations, similar to Equations (3) and (4), for layers $N+1, \ldots, N'$. Layer N' represents the medium (e.g., air) just below and in direct mechanical contact with the substrate, as occurs in at least two additional embodiments. In the first additional embodiment, layer N is a terminating layer of the substrate (i.e., a bottom layer of the substrate), so that N'=N+1. In the second additional embodiment, the substrate comprises additional layers below layer N, so that N'>N+1.

2.2 Angular Incidence of Radiation

FIG. 18 depicts radiation 80 as incident on a stack of the substrate 10 at a solid angle $\Omega$ with respect to a direction 17, in accordance with embodiments of the present invention. In FIG. 18, the stack comprises N−1 layers denoted as layers 1, 2, ..., N−1. Layer 0 characterizes the medium from which the radiation enters the stack at top surface 19, and layer N represents the base layer 15 into which the radiation is transmitted from layer N−1 of the stack at interfacial layer 14.

Figure 19:
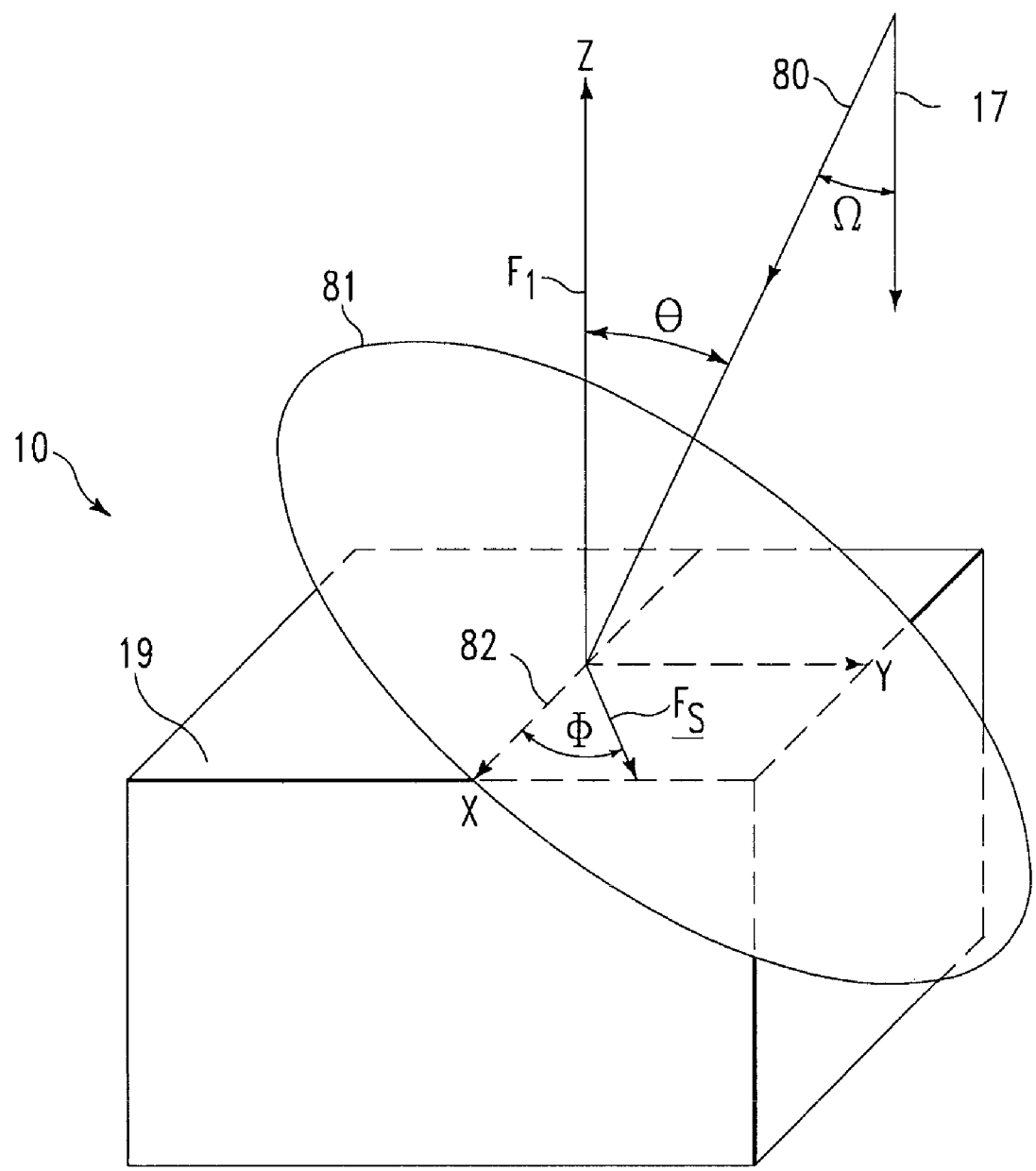
FIG. 19 depicts the substrate and radiation of FIG. 18 such that the solid angle defines a polar angle and an azimuthal angle with respect to a rectangular coordinate system, in accordance with embodiments of the present invention.

FIG. 19 depicts the substrate 10 and radiation 80 of FIG. 18 such that the solid angle $\Omega$ defines a polar angle $\theta$ and an azimuthal angle $\Phi$ with respect to a rectangular coordinate system having orthogonal axes X, Y, and Z, in accordance with embodiments of the present invention. The plane 81 is normal to the incident radiation 80. The electric and magnetic field vectors associated with the radiation 80 are in the plane 81. The plane 81 intersects the substrate 10 in the line 82 which is the X axis of the coordinate system. The Y axis is in the plane of the top surface 19 of the substrate 10 and is orthogonal to the X axis. The Z axis is orthogonal to the plane of the top surface 19 of the substrate 10. Thus the polar angle $\theta$ is the angle between the direction of the radiation 80 and the Z axis. The X axis is in both the plane of the substrate 10 and the plane 81. The Y axis is in the plane of the substrate 10 and at an angle $\theta$ with respect to the plane 81.

Let $\underline{F}$ be a vector representing the forward electric field (in the plane 81) associated with the incident radiation 80 into the substrate 10, wherein F denotes the magnitude of $\underline{F}$. Let $\underline{F}_Z$ be a vector representing the electric field projected onto the Z axis, wherein $F_Z$ denotes the magnitude of $\underline{F}_Z$. Let $\underline{F}_S$ be a vector representing the electric field projected onto the plane of the top surface 19 of the substrate 10. The azimuthal angle $\Phi$ is the angle between the X axis and $\underline{F}_S$ as shown. Let $F_X$ and $F_Y$ denote the magnitude of the projection of $\underline{F}_S$ onto the X axis and the Y axis, respectively. Based on the preceding definitions, $F_X$, $F_Y$, and $F_Z$ are related to F, $\theta$, and $\Phi$ via:

$$F_X = F \cos\theta \cos\Phi \quad (5)$$

$$F_Y = F \cos\theta \sin\Phi \quad (6)$$

$$F_Z = F \sin\theta \quad (7)$$

In FIGS. 17-18, the forward component and reverse component of the radiation 80 are associated with the directions 17 and 18, respectively. The index of refraction of layer m is $n_m$, and $z_m$ denotes the coordinate value along the Z axis in the direction 17 at the interface between layer m and layer m+1 (m=0, 1, ..., N−1), wherein $z_0 = 0$. $F_{X,m}$, $F_{Y,m}$, and $F_{Z,m}$ denote the electric field complex amplitude in the X, Y, and Z direction, respectively, in layer m (m=0, 1, ..., N) for the forward component of the radiation 80. $R_{X,m}$, $R_{Y,m}$, and $R_{Z,m}$ denote the electric field complex amplitude in the X, Y, and Z direction, respectively, in layer m (m=0, 1, ..., N) for the reverse component of the radiation 80. Physically, the reflected components $R_{X,m}$, $R_{Y,m}$, and $R_{Z,m}$ are generated by the discontinuity in index of refraction at the interfaces (i.e., between layers m−1 and m for m=1, 2, ..., N). Note that in the description infra, the upper case symbols X, Y, Z denote coordinates axes, whereas the lower case symbols x, y, z denote the coordinate values respectively corresponding to the coordinates axes X, Y, Z.

Continuity of the X component of electric field and its derivative at the interface between layers m−1 and m (m=1, 2, ..., N) respectively results in the following equations:

$$F_{X,m-1}\exp(ik_{m-1}z_{m-1}) + R_{X,m-1}\exp(-ik_{m-1}z_{m-1}) = \quad (8)$$
$$F_{X,m}\exp(ik_m z_m) + R_{X,m}\exp(-ik_m z_m)$$

$$k_{m-1}F_{X,m-1}\exp(ik_{m-1}z_{m-1}) - k_{m-1}R_{X,m-1}\exp(-ik_{m-1}z_{m-1}) = \quad (9)$$
$$k_m F_{X,m}\exp(ik_m z_m) - k_m R_{X,m}\exp(-ik_m z_m)$$

wherein $k_m = 1/(2\pi n_m \lambda)$.

Continuity of the Y component of electric field and its derivative at the interface between layers m−1 and m (m=1, 2, ..., N) respectively results in the following equations:

$$F_{Y,m-1}\exp(ik_{m-1}z_{m-1}) + R_{Y,m-1}\exp(-ik_{m-1}z_{m-1}) = \quad (10)$$
$$F_{Y,m}\exp(ik_m z_m) + R_{Y,m}\exp(-ik_m z_m)$$

$$k_{m-1}F_{Y,m-1}\exp(ik_{m-1}z_{m-1}) - k_{m-1}R_{Y,m-1}\exp(-ik_{m-1}z_{m-1}) = \quad (11)$$
$$k_m F_{Y,m}\exp(ik_m z_m) - k_m R_{Y,m}\exp(-ik_m z_m)$$

Let $D_{Z,m}$ denote the displacement complex amplitude in the Z direction in layer m and let $\in_m$ denote the permittivity of layer m (m=0, 1, ..., N). $D_{Z,m} = n^2_m F_{Z,m}$, since $D_{Z,m} = \in_m F_{Z,m}$ and $n_m = (\in_m)^{1/2}$ (m=0, 1, 2, ..., N). Therefore, continuity of the Z component of the displacement and its derivative in the direction Z (i.e., direction 17) at the interface between layers m−1 and m (m=1, 2, ..., N) respectively results in the following equations:

$$n^2_{m-1}(F_{Z,m-1}\exp(ik_{m-1}z_{m-1}) + R_{Z,m-1}\exp(-ik_{m-1}z_{m-1})) = \quad (12)$$
$$n^2_m(F_{Z,m}\exp(ik_m z_m) + R_{Z,m}\exp(-ik_m z_m))$$

$$n^2_{m-1}(k_{m-1}F_{Z,m-1}\exp(ik_{m-1}z_{m-1}) - k_{m-1}R_{Z,m-1}\exp(-ik_{m-1}z_{m-1})) = \quad (13)$$
$$n^2_m(k_m F_{Z,m}\exp(ik_m z_m) - k_m R_{Z,m}\exp(-ik_m z_m))$$

Equations (5)-(7) provide boundary conditions of $F_{X,0} = F_0 \cos\theta \cos\Phi$, $F_{Y,0} = F_0 \cos\theta \sin\Phi$, and $F_{Z,0} = F_0 \sin\theta$, for a given electric field magnitude $F_0$ in layer 0. Additional boundary conditions which may be employed are $R_{X,N} = R_{Y,N} = R_{Z,N} = 0$. For the preceding boundary conditions, Equations (8)-(13) provide 6N linear equations and there are 6N unknowns ($F_{X,1}$, $F_{Y,1}, F_{Z,1}, \ldots, F_{X,N}, F_{Y,N}, F_{Z,N}, R_{X,0}, R_{Y,0}, R_{Z,0}, \ldots, R_{X,N-1}, R_{Y,N-1}, R_{Z,N-1}$) which may be solved by any method (e.g., matrix inversion) known to a person of ordinary skill in the art.

The resultant transmission coefficient T is calculated as $T = (1 - |R_{X,0}|^2 - |R_{Y,0}|^2 - |R_{Z,0}|^2)/(|F_{X,0}|^2 + (|F_{Y,0}|^2 + (|F_{Z,0}|^2)$. However, $|F_{X,0}|^2 + (|F_{Y,0}|^2 + (|F_{Z,0}|^2 = |F_0|^2$ from the preceding boundary conditions of $F_{X0} = F \cos \theta \cos \Phi$, $F_{Y0} = F \cos \theta \sin \Phi$, and $F_{Z0} = F \sin \theta$. Therefore $T = (1 - |R_{X,0}|^2 - |R_{Y,0}|^2 - |R_{Z,0}|^2)/|F_0|^2$. Note that the value $F_0$ (e.g., $F_0 = 1$) is arbitrary and any numerical value could have been chosen for $F_0$, since the transmission coefficient is the fraction of transmitted energy flux and therefore does not depend on the magnitude of $F_0$.

The preceding exemplary boundary condition of $R_{X,N} = R_{Y,N} = R_{Z,N} = 0$ may occur if all of the radiation entering layer N through the stack shown in FIG. 18 is absorbed in layer N. Alternative embodiments may be characterized by a non-zero value in at least one of $R_{X,N}$, $R_{Y,N}$, and $R_{Z,N}$. These alternative embodiments can be treated in a similar manner as with the $R_{X,N} = R_{Y,N} = R_{Z,N} = 0$ embodiment described supra, by setting the reflection coefficients $R_{X,N'}$, $R_{Y,N'}$, and $R_{Z,N'}$ to zero in a layer N'>N in which no reflections occur and adding additional equations, similar to Equations (8)-(13), for layers N+1, ..., N'. Layer N' represents the medium (e.g., air) just below and in direct mechanical contact with the substrate, as occurs in at least two additional embodiments. In the first additional embodiment, layer N is a terminating layer of the substrate (i.e., a bottom layer of the substrate), so that N'=N+1. In the second additional embodiment, the substrate comprises additional layers below layer N, so that N'>N+1.

3. Computer System

Figure 20:
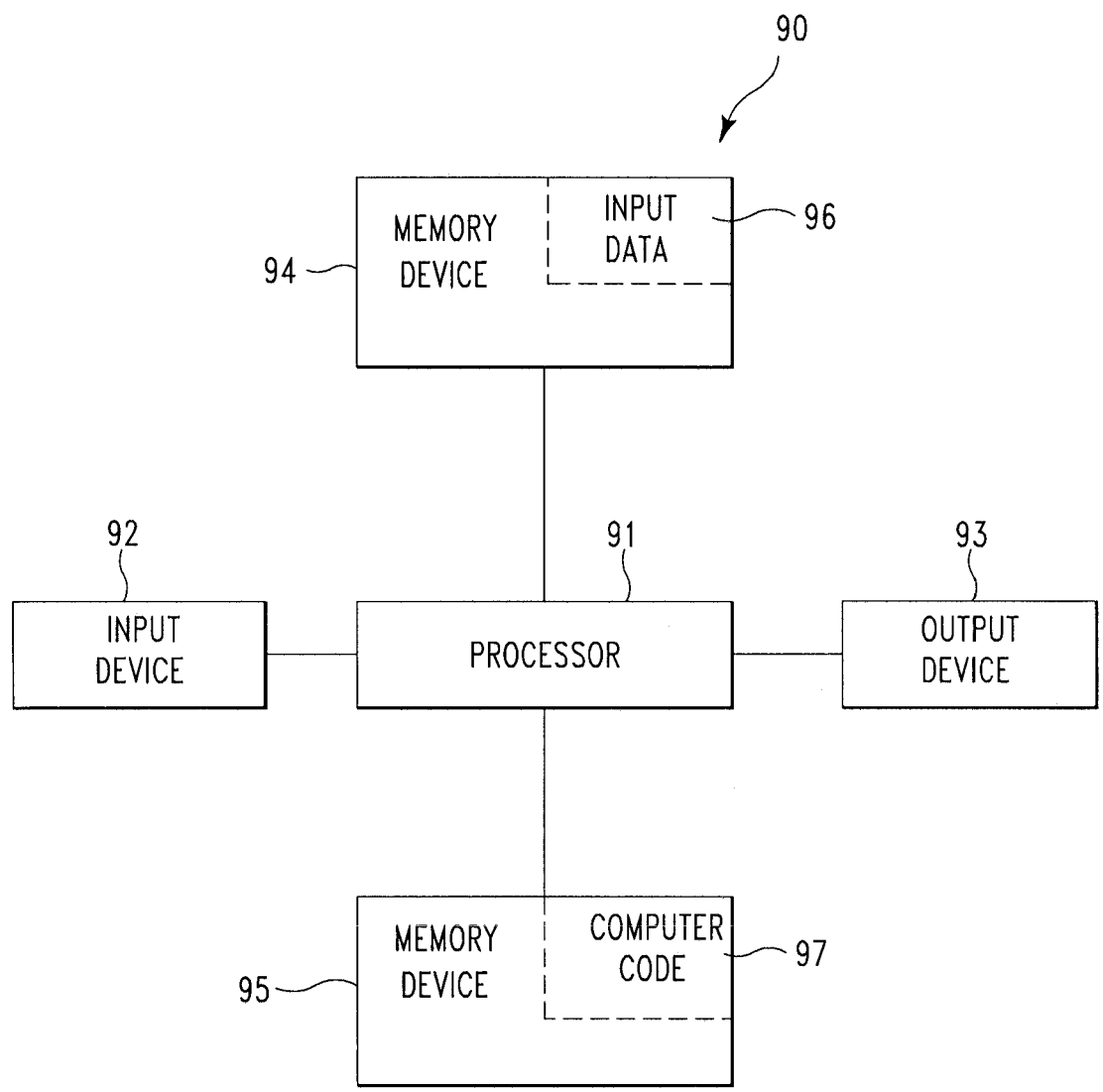
FIG. 20 illustrates a computer system used for designing a mask, in accordance with embodiments of the present invention.

FIG. 20 illustrates a computer system 90 used for designing a mask, in accordance with embodiments of the present invention. The computer system 90 comprises a processor 91, an input device 92 coupled to the processor 91, an output device 93 coupled to the processor 91, and memory devices 94 and 95 each coupled to the processor 91. The input device 92 may be, inter alia, a keyboard, a mouse, etc. The output device 93 may be, inter alia, a printer, a plotter, a computer screen, a magnetic tape, a removable hard disk, a floppy disk, etc. The memory devices 94 and 95 may be, inter alia, a hard disk, a floppy disk, a magnetic tape, an optical storage such as a compact disc (CD) or a digital video disc (DVD), a dynamic random access memory (DRAM), a read-only memory (ROM), etc. The memory device 95 includes a computer code 97 which is a computer program that comprises computer-executable instructions. The computer code 97 includes an algorithm for designing a mask as described supra. The processor 91 executes the computer code 97. The memory device 94 includes input data 96. The input data 96 includes input required by the computer code 97. The output device 93 displays output from the computer code 97. Either or both memory devices 94 and 95 (or one or more additional memory devices not shown in FIG. 20) may be used as a computer usable medium (or a computer readable medium or a program storage device) having a computer readable program embodied therein and/or having other data stored therein, wherein the computer readable program comprises the computer code 97. Generally, a computer program product (or, alternatively, an article of manufacture) of the computer system 90 may comprise said computer usable medium (or said program storage device).

While FIG. 20 shows the computer system 90 as a particular configuration of hardware and software, any configuration of hardware and software, as would be known to a person of ordinary skill in the art, may be utilized for the purposes stated supra in conjunction with the particular computer system 90 of FIG. 20. For example, the memory devices 94 and 95 may be portions of a single memory device rather than separate memory devices.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A method for creating a mask, comprising:

receiving a specified target transmittance ($T_S$) of a substrate with respect to a first radiation configured to be propagated from a radiation source and transmitted through the mask with spatial selectivity in accordance with a spatially varying transmissivity ($T_M$) of the mask with respect to the first radiation; and establishing the mask, wherein said establishing the mask is selected from the group consisting of forming the mask and both designing and forming the mask, and wherein said establishing the mask is subject to: with the mask disposed between the radiation source and a surface portion of a top surface of the substrate, the first radiation after having passed through the mask is denoted as a second radiation that is transmitted into the surface portion of the top surface of the substrate in accordance with a spatially varying reflectance (R) of the surface portion with respect to the second radiation, wherein $T_M*(1-R)$ is about equal to $T_S$.

2. The method of claim 1, wherein the substrate comprises L substrate regions such that L is at least 1;

wherein the L substrate regions consist of G groups of substrate regions, each group consisting of M substrate regions such that G is at least 1, M is at least 1, and L=G*M;

wherein each substrate region of the L substrate regions has about a same geometric structure and about a same material composition;

wherein each substrate region of each group of M substrate regions comprises N substrate subregions denoted as substrate subregions 1, 2, ..., N such N is at least 2;

wherein a top surface of substrate subregion n of each substrate region is comprised by the surface portion and has a reflectance R(n) with respect to the second radiation for n=1, 2, ..., N;

wherein the specified target transmittance for subregion n of each substrate region with respect to the first radiation is denoted as $T_S(n)$;

wherein the mask comprises M mask regions, each mask region having about a same geometric structure and a same material composition, said M mask regions respectively corresponding to M substrate regions on a one-to-one basis for each group of M substrate regions of the G groups;

wherein each mask region comprises N mask subregions denoted as mask subregion 1, 2, ..., N, said N mask subregions of each mask region respectively corresponding to the N substrate subregions of a corresponding substrate region of the M substrate regions for each group of M substrate regions of the G groups;

wherein mask subregion n of each mask region has a transmissivity $T_M(n)$ with respect to the first radiation such that $T_M(n)*(1-R(n))$ is about equal to $T_S(n)$ for n=1, 2, ..., N and wherein the spatially varying transmissivity ($T_M$) of the mask is characterized by spatial variations among $T_M(1), T_M(2), \ldots, T_M(N)$.

3. The method of claim 2,
wherein each mask subregion of each mask region independently comprises a contiguous subregion portion and K non-contiguous subregion portions distributed within the contiguous subregion such that K is mask subregion independent and is at least 1;
wherein the contiguous subregion portion of each mask subregion of each mask region is about totally transparent to the first radiation;
wherein the K non-contiguous subregion portions of each mask subregion of each mask region are about totally reflective or are absorptive with respect to the first radiation;
wherein each non-contiguous subregion portion of the K non-contiguous subregion portions of a first mask subregion of the N mask subregions of a first mask region of the M mask regions independently has a cross-sectional shape and a cross-sectional surface area configured to be exposed to the first radiation; and
wherein the transmissivity $T_M(n)$ in mask subregion n of the N mask subregions in each mask region is a spatially averaged transmissivity over the contiguous subregion portion and the K non-contiguous subregion portions in mask subregion n for $n=1, 2, \ldots, N$.

4. The method of claim 2, wherein the substrate is a semiconductor wafer, wherein the same material composition of each substrate region of the L substrate regions comprises a semiconductor material, wherein the G=1, and wherein the first radiation comprises a continuous distribution of wavelengths.

5. The method of claim 2, wherein the substrate is a semiconductor wafer, wherein the same material composition of each substrate region of the L substrate regions comprises a semiconductor material, wherein G is at least 2, and wherein the first radiation is monochromatic.

6. The method of claim 1, wherein said establishing the mask comprises designing the mask.

7. The method of claim 1, wherein said establishing the mask comprises forming the mask.

8. A computer program product, comprising a computer readable storage medium having a computer readable program that when executed on a computer causes the computer to perform the method of claim 1, wherein said establishing the mask consists of designing the mask.

9. A method for irradiating a substrate, said method comprising:
providing a mask;
propagating a first radiation from a radiation source through the mask disposed between the radiation source and a surface portion of a top surface of the substrate,
wherein the first radiation is transmitted with spatial selectivity through the mask in accordance with a spatially varying transmissivity ($T_M$) of the mask with respect to the first radiation,
wherein the first radiation after having passed through the mask being is denoted as a second radiation,
wherein the second radiation is incident upon the surface portion and is transmitted into the surface portion of the substrate in accordance with a spatially varying reflectance (R) with respect to the second radiation, and
wherein $T_M*(1-R)$ is about equal to a specified target transmittance ($T_S$) of the substrate with respect to the first radiation.

10. The method of claim 9,
wherein the substrate comprises L substrate regions such that L is at least 1;
wherein the L substrate regions consist of G groups of substrate regions, each group consisting of M substrate regions such that G is at least 1, M is at least 1, and L=G*M;
wherein each substrate region of the L substrate regions has about a same geometric structure and about a same material composition;
wherein each substrate region of each group of M substrate regions comprises N substrate subregions denoted as substrate subregions $1, 2, \ldots, N$ such N is at least 2;
wherein a top surface of substrate subregion n of each substrate region is comprised by the surface portion and has a reflectance R(n) with respect to the second radiation for $n=1, 2, \ldots, N$;
wherein the specified target transmittance for subregion n of each substrate region with respect to the first radiation is denoted as $T_S(n)$;
wherein the mask comprises M mask regions, each mask region having about a same geometric structure and a same material composition, said M mask regions respectively corresponding to M substrate regions on a one-to-one basis for each group of M substrate regions of the G groups;
wherein each mask region comprises N mask subregions denoted as mask subregion $1, 2, \ldots, N$, said N mask subregions of each mask region respectively corresponding to the N substrate subregions of a corresponding substrate region of the M substrate regions for each group of M substrate regions of the G groups;
wherein mask subregion n of each mask region has a transmissivity $T_M(n)$ with respect to the first radiation such that $T_M(n)*(1-R(n))$ is about equal to $T_S(n)$ for $n=1, 2, \ldots, N$;
wherein the spatially varying transmissivity ($T_M$) of the mask is characterized by spatial variations among $T_M(1), T_M(2), \ldots, T_M(N)$; and
wherein said propagating comprises serially irradiating the G groups by the second radiation by moving the mask and the substrate relative to each other, such that as each group is irradiated by the second radiation, the remaining groups are blocked from the second radiation.

11. The method of claim 10,
wherein each mask subregion of each mask region independently comprises a contiguous subregion portion and K non-contiguous subregion portions distributed within the contiguous subregion such that K is at least 1;
wherein the contiguous subregion portion of each mask subregion of each mask region is about totally transparent to the first radiation;
wherein the K non-contiguous subregion portions of each mask subregion of each mask region are about totally reflective or are absorptive with respect to the first radiation;
wherein each non-contiguous subregion portion of the K non-contiguous subregion portions of a first mask subregion of the N mask subregions of a first mask region of the M mask regions independently has a cross-sectional shape and a cross-sectional surface area configured to be exposed to the first radiation; and
wherein the transmissivity $T_M(n)$ in mask subregion n of the N mask subregions in each mask region is a spatially averaged transmissivity over the contiguous subregion portion and the K non-contiguous subregion portions in mask subregion n for $n=1, 2, \ldots, N$.

12. The method of claim 10, wherein the substrate is a semiconductor wafer, wherein the same material composition of each substrate region of the L substrate regions comprises a semiconductor material, wherein the G=1, and wherein the first radiation comprises a continuous distribution of wavelengths.

13. The method of claim 10, wherein the substrate is a semiconductor wafer, wherein the same material composition of each substrate region of the L substrate regions comprises a semiconductor material, wherein G is at least 2, and wherein the first radiation is monochromatic.

14. The method of claim 9, wherein the method further comprises:
   prior to said propagating the first radiation, irradiating the substrate with an initial radiation from an initial radiation source to anneal the substrate without passing the initial radiation through an intervening mask disposed between the initial radiation source and the substrate.

15. A mask, comprising:
   M mask regions such that M is at least 1;
   each mask region having a same geometric structure and material composition;
   each mask region comprising N mask subregions denoted as mask subregion 1, 2, ..., N such that N is at least 2;
   each mask region of the M mask regions respectively corresponding to an associated substrate region of M substrate regions of a substrate;
   each mask subregion of each mask region independently comprising a contiguous subregion portion and K non-contiguous subregion portions distributed within the contiguous subregion portion such that K is mask subregion independent and is at least 1;
   the contiguous subregion portion of each mask subregion of each mask region of the M mask regions being about totally transparent to a first radiation incident upon the M mask regions;
   the K non-contiguous subregion portions of each mask region of the M mask regions being about totally reflective or being absorptive with respect to the incident first radiation;
   each non-contiguous subregion portion of the K non-contiguous subregion portions of each mask region of the N mask regions independently having a cross-sectional shape and a cross-sectional surface area configured to be exposed to the incident first radiation;
   each mask subregion of the N mask subregions of each mask region of the M mask regions respectively corresponding to an associated substrate subregion of N substrate subregions of a corresponding substrate region of the M substrate regions of the substrate;
   a specified target transmittance for subregion n of each substrate region with respect to the first radiation being denoted as $T_S(n)$ for n=1, 2, ... N;
   a top surface of substrate subregion n of each substrate region having a reflectance R(n) with respect to a second radiation for n=1, 2, ... N, said second radiation being the first radiation after the first radiation has passed through the mask;
   each mask subregion n of each mask region having a transmissivity $T_M(n)$ with respect to the first radiation such that $T_M(n)*(1-R(n))$ is about equal to $T_S(n)$ for n=1, 2, ..., N;
   a spatially varying transmissivity ($T_M$) of the mask being characterized by spatial variations among $T_M(1)$, $T_M(2)$, ..., $T_M(N)$; and
   said transmissivity $T_M(n)$ in mask subregion n of the N mask subregions in each mask region being a spatially averaged transmissivity over the contiguous subregion portion and the K non-contiguous subregion portions in mask subregion n for n=1, 2, ..., N.

16. A system for irradiating a substrate, said system comprising:
   a radiation source for propagating a first radiation through a mask with spatial selectivity in accordance with a spatially varying transmissivity ($T_M$) of the mask with respect to the first radiation; and
   said mask, wherein said mask is disposed between the radiation source and a surface portion of a top surface of the substrate, wherein the mask is configured to enable a second radiation consisting of the first radiation after having passed through the mask to be transmitted into the surface portion of the top surface of the substrate in accordance with a spatially varying reflectance (R) of the surface portion with respect to the second radiation, and wherein $T_M*(1-R)$ is about equal to a specified target transmittance ($T_S$).

17. The mask of claim 15, wherein $T_S(n)$ is constant and independent of n for n=1, 2, ... N.

18. The mask of claim 17, wherein the K non-contiguous subregion portions of each mask subregion of each mask region are totally reflective or absorptive with respect to the first radiation.

19. The mask of claim 17, wherein K is at least 3, and wherein the K non-contiguous subregion portions of a first mask subregion of a first mask region of the M mask regions are uniformly distributed or non-uniformly distributed within the contiguous subregion portion of the first mask subregion.

20. The mask of claim 17, wherein $T_S(n)$ is different for at least two values of n for n=1, 2, ... N.

* * * * *